(12) United States Patent
Hirai

(10) Patent No.: US 7,214,617 B2
(45) Date of Patent: May 8, 2007

(54) METHOD OF FORMING THIN FILM PATTERN, METHOD OF MANUFACTURING DEVICE, ELECTRO-OPTICAL APPARATUS AND ELECTRONIC APPARATUS

(75) Inventor: Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 313 days.

(21) Appl. No.: 10/803,027

(22) Filed: Mar. 18, 2004

(65) Prior Publication Data

US 2005/0191781 A1    Sep. 1, 2005

(30) Foreign Application Priority Data

Apr. 1, 2003  (JP) .............. 2003-098274
Mar. 12, 2004 (JP) .............. 2004-070834

(51) Int. Cl.
  *H01L 21/44* (2006.01)
(52) U.S. Cl. .............. 438/676; 438/30; 438/99
(58) Field of Classification Search ............ 438/30, 438/676, 677, 675, 99
See application file for complete search history.

(56) References Cited

U.S. PATENT DOCUMENTS

| | | | |
|---|---|---|---|
| 5,132,248 A | 7/1992 | Drummond et al. | |
| 7,008,809 B2 * | 3/2006 | Hasei | 438/30 |
| 7,015,503 B2 * | 3/2006 | Seki et al. | 257/40 |
| 2005/0191781 A1 * | 9/2005 | Hirai | 438/30 |
| 2005/0221524 A1 * | 10/2005 | Hirai | 438/30 |
| 2005/0245079 A1 * | 11/2005 | Honda et al. | 438/676 |
| 2006/0033105 A1 * | 2/2006 | Fujii et al. | 257/66 |
| 2006/0046336 A1 * | 3/2006 | Shoji et al. | 438/30 |
| 2006/0115983 A1 * | 6/2006 | Fujii et al. | 438/640 |

FOREIGN PATENT DOCUMENTS

| | | |
|---|---|---|
| EP | 0 989 778 A1 | 3/2000 |
| KR | 2001-0012686 | 2/2001 |

* cited by examiner

*Primary Examiner*—M. Wilczewski
(74) *Attorney, Agent, or Firm*—Oliff & Berridge, PLC.

(57) ABSTRACT

A method of forming a thin film pattern by placing a functional liquid on a substrate, includes a bank formation step of forming banks in accordance with the thin film pattern on the substrate, a residue processing step of removing residue between the banks, and a material placement step of placing the functional liquid between the banks removed the residue.

21 Claims, 13 Drawing Sheets

METHOD OF FORMING THIN FILM PATTERN, METHOD OF MANUFACTURING DEVICE, ELECTRO-OPTICAL APPARATUS AND ELECTRONIC APPARATUS

BACKGROUND OF THE INVENTION

1. Field of the Invention

The present invention relates to a method of filming a thin film pattern and a method of manufacturing a device, and to an electro-optical apparatus and an electronic apparatus.

Priority is claimed on Japanese Patent Application No. 2003-98274, filed Apr. 1, 2003 and Japanese Patent Application No. 2004-70834, filed Mar. 12, 2004, the contents of which are incorporated herein by reference.

2. Description of Related Art

A photolithographic method, for example, is employed in the manufacture of devices having wiring such as electronic circuits and integrated circuits. In this photolithographic method, a photosensitive material known as resist is coated on a substrate on which an electroconductive film has been coated in advance. A circuit pattern is then irradiated thereon and the resist is developed. The electroconductive film is then etched in accordance with the resist pattern so as to form a thin film wiring pattern. This photolithographic method requires large scale equipment such as a vacuum apparatus and also requires complicated processing. Moreover, the material utilization efficiency is approximately several percent and it is necessary to scrap the greater part thereof, so that manufacturing costs are high.

In contrast to this, in U.S. Pat. No. 5,132,248, there is proposed a method of forming a wiring pattern on a substrate using what is known as an inkjet method, which is a droplet discharge method in which a liquid material in droplet form is discharged from a droplet discharge head. In this method, wiring pattern formation ink, which is a functional liquid in which electroconductive fine particles such as metallic fine particles have been dispersed, is coated in a pattern directly on a substrate. Heat processing and laser irradiation are then performed so as to convert this into a thin film electroconductive pattern. According to this method, photolithography becomes unnecessary so that the process is considerably simplified. In addition, this method has the merit that only a small amount of raw materials are used.

However, in the above described conventional technology, the following problem exists.

When the functional liquid is placed on the substrate in order to form the wiring pattern, if there is any residue on the substrate, then, in some cases, the functional liquid may not be placed uniformly on the substrate which becomes a cause of the occurrence of malfunctions such as bulges and wiring breakages The present invention was conceived in view of the above point, and it is an object thereof to provide a method of forming a thin film pattern and a method of manufacturing a device, as well as an electro-optical apparatus and an electronic apparatus that enable the generation of malfunctions such as wiring breakages and the like to be suppressed.

SUMMARY OF THE INVENTION

The present invention employs the structure described below in order to achieve the above described object.

The first aspect of the present invention is a method of forming a thin film pattern by placing a functional liquid on a substrate, having a bank formation step of forming banks in accordance with the thin film pattern on the substrate, a residue processing step of removing residue between the banks, and a material placement step of placing the functional liquid between the banks removed the residue. In this case, the residue processing step has a step in which residue in bottom portions between the banks is removed.

According to this aspect, because a residue processing step is provided in which residue is removed, it is possible to place the functional liquid uniformly on the substrate. Accordingly, the generation of bulges is suppressed, and the thin film pattern that is formed is able to avoid the occurrence of malfunctions such as broken wires and the like. In addition, because a structure is employed in which the functional liquid used to form the thin film pattern is placed between banks formed on the substrate, it is possible to prevent droplets of the functional liquid from scattering peripherally, and it is possible to form the thin film pattern smoothly and in a predetermined configuration that follows the bank configuration. In the residue processing step it is possible to improve the adhesion of the thin film pattern on the substrate, in particular, by removing residue from bottom portions between banks.

In this case, the residue processing step may have a photo irradiation processing step.

According to the present invention, by irradiating light such as, for example, ultraviolet rays (UV), it is possible to excellently remove residue, in particular, organic based residue using photo excitation.

It is also possible to employ a structure in which the residue processing step has a plasma processing step that uses a predetermined processing gas.

According to the present invention, it is possible to excellently remove residue, in particular, organic based residue using $O_2$ plasma processing that employs a processing gas that contains, for example, oxygen (i.e., $O_2$) as a predetermined processing gas.

Moreover, it is also possible to employ a structure in which the residue processing step has a plasma processing step that uses a predetermined processing gas and a photo irradiation processing step. Namely, it is possible to remove the residue by combining photo irradiation processing that uses ultraviolet rays (UV) with $O_2$ plasma processing that employs, for example, oxygen (i.e., $O_2$) as a processing gas. Alternatively, the residue can be removed by performing etching using acid.

It is also possible for the banks to be formed so as to extend in a predetermined direction, and for the plasma processing step to supply the processing gas while relatively moving the substrate in the predetermined direction relative to the processing gas.

According to the present invention, when performing plasma processing while moving the processing gas supply section and the substrate relatively to each other, by supplying processing gas while matching the direction of movement of the substrate with the direction in which the groove portions provided between the banks extend, it is possible to spread the processing gas excellently over the entire area of the groove portions formed between the banks. Accordingly, the residue removal can be performed excellently.

It is also possible to include the residue processing step before or after the repellency processing step of imparting repellency to the banks.

According to the present invention, because repellency has been imparted to the banks by the repellency processing that is performed after the residue processing, even if a portion of the discharged droplets lands on a bank, because the banks surface is liquid repellent the droplet is repelled from the bank and runs down into the groove portion between the banks. Accordingly, it is possible to place the discharged functional liquid excellently between the banks on the substrate.

It is also possible for the residue processing step to be performed once again after the material placement step.

According to the present invention, there are cases when, for example, in order to make a thin film pattern more thick, droplets of the functional liquid are laminated a plurality of times on the substrate, however, by performing the residue processing after the droplets of functional liquid have been placed on the substrate but before the next droplets have been laminated, residue of the functional liquid adhering to the banks is removed so that even if the functional liquid adheres to the banks so that the repellency of the banks is deteriorated, residue of the functional layer, which is the cause of the repellency of the banks deteriorating, is removed. Accordingly, it is possible for the banks to exhibit the same properties as those before the subsequent droplets were laminated.

In the present aspect, it is possible for the functional liquid to contain a material that exhibits electroconductivity after undergoing heat processing or light processing. Alternatively, in the present aspect it is possible for the functional liquid to contain electroconductive fine particles.

According to the present invention, it is possible to form a thin film pattern into a wiring pattern and apply this to a variety of device types. Moreover, by using light emitting element forming materials such as organic EL or using RGB ink materials in addition to the electroconductive fine particles and organosilver compound, the present invention can be applied to the manufacture of organic EL devices and liquid crystal display devices and the like having color filters.

The second aspect of the present invention is a device manufacturing method having a step of forming a thin film pattern on the substrate using the above described method of forming a thin film pattern.

According to this aspect, it is possible to obtain a device that has a thin film pattern that firmly adheres to the substrate and in which the occurrence of malfunctions such as broken wires is suppressed.

The third aspect of the present invention is an electro-optical apparatus having a device manufactured using the above described device manufacturing method.

The fourth aspect of the present invention is an electronic apparatus having the above described electro-optical apparatus.

According to these aspects, it is possible to obtain an electro-optical apparatus and an electronic apparatus that have a thin film pattern in which the occurrence of malfunctions such as broken wires is suppressed.

The fifth aspect of the present invention is a method of manufacturing an active matrix substrate having a first step of forming a gate wire on a substrate, a second step of forming a gate insulating film on the gate wire, a third step of laminating a semiconductor layer via the gate insulating film, a fourth step of forming a source electrode and drain electrode on the gate insulating film, a fifth step of placing a non-conductive material on the source electrode and the drain electrode, a sixth step of forming a pixel electrode after the placement of the insulating material, wherein at least one of the first, fourth, and sixth steps further having a bank forming step of forming banks to correspond to a formation pattern, a residue processing step of removing residue between the banks, and a material placement step of placing the functional material between the banks removed the residue by being discharged using a droplet discharge apparatus.

According to this aspect, because a residue processing step is provided in which residue is removed, it is possible to place the functional liquid uniformly on the substrate. Accordingly, the generation of bulges is suppressed, and the thin film pattern that is formed is able to avoid the occurrence of malfunctions such as broken wires and the like. Accordingly, it is possible to manufacture an active matrix substrate that has desired characteristics.

DETAILED DESCRIPTION OF THE INVENTION

Figure 1:
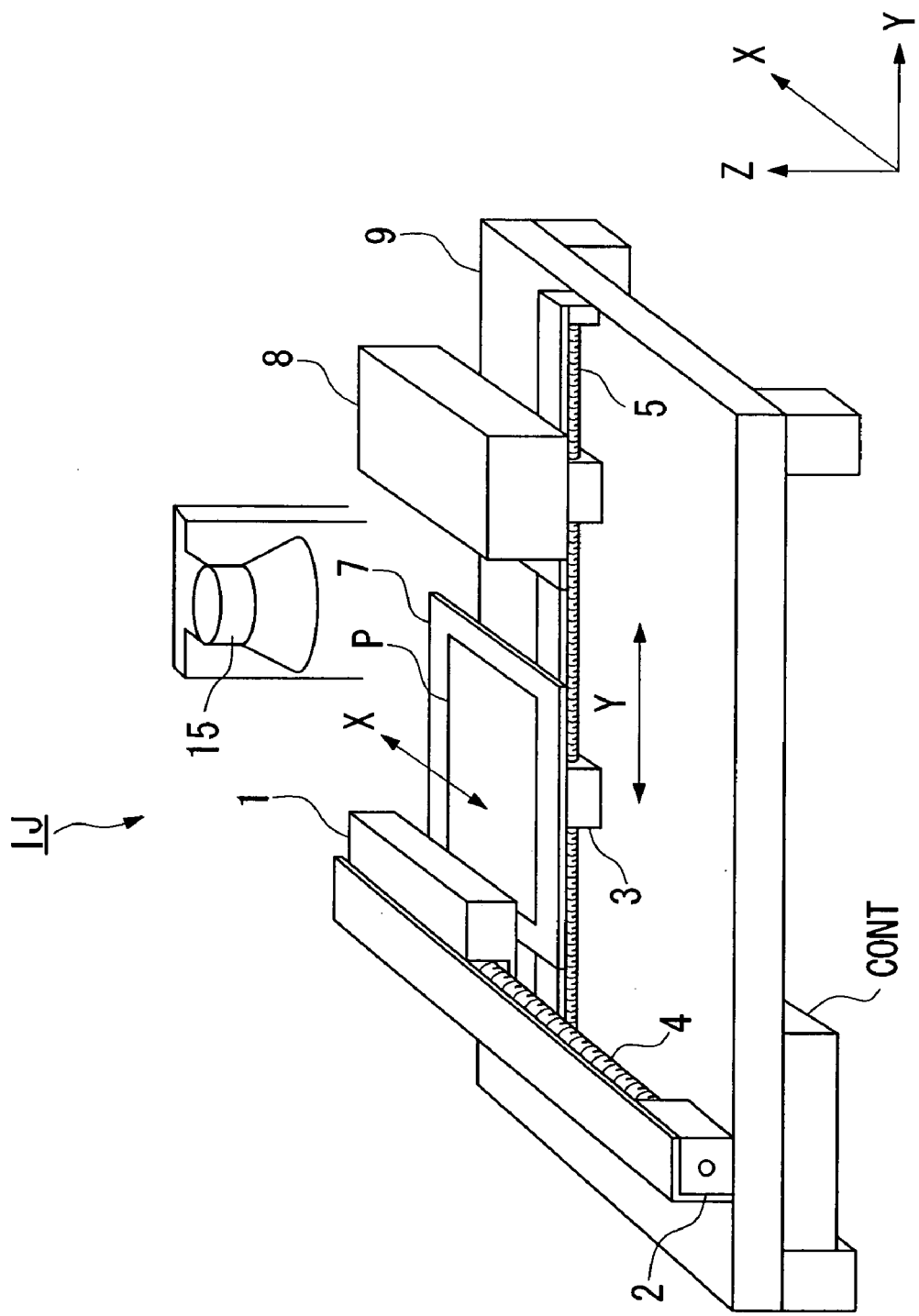
FIG. 1 is a schematic perspective view of a droplet discharge apparatus.

Embodiments of the method of forming a thin film pattern and the method of manufacturing a device of the present invention will now be described with reference made to the drawings. In the present embodiment, an example is used of when wiring pattern (i.e., thin film pattern) formation ink (i.e., functional liquid) that includes a material that exhibits electroconductivity after undergoing heat processing or the like is discharged in droplet form from discharge nozzles of a droplet discharge head by a droplet discharge method, so as to form a wiring pattern formed by an electroconductive film on a substrate.

Firstly, the ink (i.e., the functional liquid) that is used will be described.

The wiring formation ink that forms the liquid material is formed using a solution that is obtained by dispersing in a solvent (i.e., in a dispersion medium) a dispersion solution that is obtained by dispersing electroconductive fine particles in a dispersion medium, or an organosilver compound, or oxidized silver nanoparticles. Examples of the electroconductive fine particles that may be used include metal fine particles containing at least one of gold, solver, copper, aluminum, palladium, and nickel, oxides of these, as well as electroconductive polymers and superconductive material fine particles, and the like. These electroconductive fine particles can be used after an organic material has been coated on the surface thereof in order to improve the dispersion properties. The particle diameter of the electroconductive finer particles is preferably from 1 nm or more to 0.1 µm or less. If the diameter is greater than 0.1 µm, then there is a possibility of blockages occurring in the discharge nozzles of the droplet discharge head that is described below. If the diameter is less than 1 nm, then the volume ratio of the coating agent to the electroconductive fine particles increases and the proportion of organic matter in the film that is obtained becomes excessive.

There is no particular restriction as to the dispersion medium provided that it is able to disperse the above described electroconductive fine particles without causing agglomerations. In addition to water, examples thereof include alcohols such as methanol, ethanol, propanol, and butanol, hydrocarbon based compounds such as n-heptane, n-octane, decane, dodecane, tetradecane, toluene, xylene, cymene, durene, indene, dipentane, tetrahydronaphthalene, decahydronaphthalene, cyclohexylbenzene, and the like, ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis (2-methoxyethyl) ether, and p-dioxane, and also polar compounds such as propylene carbonate, γ-butyrolactone, N-methyl-2-pyrolidone, dimethyl formamide, dimethyl sulfoxide, cyclohexanone, and the like. Among these, in view of the dispersibility of the fine particles and the stability of the dispersion solution thereof, as well as in view of their applicability to the droplet discharge method, water, alcohols, hydrocarbon based compounds, and ether based compounds are preferable, and more preferable dispersion mediums include water and hydrocarbon based compounds.

The surface tension of the dispersion solution of the above described electroconductive fine particles is preferably within a range from 0.02 N/m or more to 0.07 N/m or less. When discharging a liquid material using a droplet discharge method, if the surface tension is less than 0.02 N/m, the wettability of the ink on the nozzle surface increases so that scattering tends to occur more easily. If the surface tension exceeds 0.07 N/m, the configuration of the mechanism at the distal end of the nozzles is unstable resulting in it being difficult to control the discharge quantity and discharge timing. In order to adjust the surface tension, a minute quantity of a surface tension adjusting agent such as a fluorine based agent, a silicon based agent, or a nonion based agent may be added to the dispersion solution insofar as it does not greatly reduce the contact angle with the substrate. Nonion based surface tension adjusting agents improve wettability of the liquid on the substrate, improve the leveling properties of the film, and are also useful in preventing the occurrence of minute bumps and indentations in the film. This surface tension adjusting agent may include, where necessary, an organic compounds such as alcohol, ether, ester, or ketone.

The viscosity of the dispersion liquid is preferably 1 mPa·s or more to 50 mPa·s or less. When ink is discharged as droplets using a droplet discharge method, if the viscosity is less than 1 mPa·s, peripheral portions of the nozzles tend to be contaminated by ink outflow. If the viscosity is greater than 50 mPa·s, the frequency of blockages occurring in the nozzle holes increases and smooth droplet discharge becomes difficult.

Various materials can be used for the substrate on which the wiring pattern is formed such as glass, quartz glass, silicon wafers, plastic films, and metal plates. It is also possible to form a base layer such as a semiconductor film, a metal film, a dielectric film, or an organic film on the surface of a substrate formed from the above described various materials.

Here, examples of the discharge technology of the droplet discharge method include an electrification control method, a pressure oscillation method, an electromechanical conversion method, a thermoelectric conversion method, and an electrostatic absorption method. The electrification control method imparts a charge to the material using an electrification electrode and controls the direction in which the material is scattered using a deflecting electrode so as to discharge the material from the discharge nozzle. The pressure discharge method applies super high pressure of approximately 30 kg/cm$^2$ so as to discharge material at the distal end side of the nozzle. When no control voltage is applied, the material moves in a straight line and is discharged from the discharge nozzle, while if a control voltage is applied, electrostatic repulsion is created among the material so that the material is scattered and is not discharged from the discharge nozzle. The electromechanical conversion method utilizes the ability of piezoelectric elements to deform when they receive electrical signals in the form of pulses. As a result of the piezoelectric element being deformed, pressure is imparted via a flexible substance to a space in which a material is stored, thereby pushing the material out from this space and causing it to be discharged from the discharge nozzle.

The thermoelectric conversion method rapidly vaporizes the material using a heater provided in the space where the material is stored so as to produce bubbles. The material within the space is discharged by the pressure from the bubbles. The electrostatic absorption method applies micro pressure into the space where the material is stored so that a meniscus is formed on the material in the discharge nozzles. The material is drawn out after electrostatic absorption is applied in this state. In addition to these, technologies such as a method that utilizes changes in the viscosity of a fluid created by an electric field, and a method in which the material is scattered by electrical discharge sparks may also be employed. The droplet discharge method has the advantages that there is little waste in the material used, and that the desired quantity of material can be accurately placed in the desired position. Note that the quantity of one droplet of liquid material discharged by the droplet discharge method may be, for example, 1 to 300 ng.

Next, a description will be given of a device manufacturing apparatus used when manufacturing the device according to the present invention.

A droplet discharge apparatus (i.e., an inkjet apparatus) that manufactures a device by discharging (i.e., dropping) droplets onto a substrate from a droplet discharge head is used as this device manufacturing apparatus.

FIG. 1 is a perspective view showing the schematic structure of a droplet discharge apparatus IJ.

In FIG. 1, the droplet discharge apparatus IJ is provided with a droplet discharge head 1, a drive shaft 4 aligned in the X axial direction, a guide shaft 5 aligned in the Y axial direction, a control apparatus CONT, a stage 7, a cleaning mechanism 8, a base 9, and a heater 15.

The stage 7 supports a substrate P on which ink (i.e., a liquid material) is placed by the droplet discharge apparatus IJ, and is provided with a fixing mechanism (not shown) that fixes the substrate P in a reference position.

The droplet discharge head 1 is a multi nozzle type of droplet discharge head that is provided with a plurality of discharge nozzles, and matches the longitudinal direction with the X axial direction. The plurality of discharge nozzles are provided at fixed intervals in the X axial direction on the bottom surface of the droplet discharge head 1. An ink that contains the above described electroconductive fine particles is discharged from the discharge nozzles of the droplet discharge head 1 onto the substrate P that is supported on the stage 7.

An X axial direction drive motor 2 is connected to the X axial direction drive shaft 4. The X axial direction drive motor 2 is a stepping motor or the like, and causes the X axial direction drive shaft 4 to rotate when an X axial direction drive signal is applied thereto from the control apparatus CONT. When the X axial direction drive shaft 4 rotates, the droplet discharge head 1 moves in the X axial direction.

The Y axial direction guide shaft 5 is fixed so that it cannot move relative to the base 9. The stage 7 is provided with a Y axial direction drive motor 3. The Y axial direction drive motor 3 is a stepping motor or the like, and moves the stage 7 in the Y axial direction when a Y axial direction drive signal is applied thereto from the control apparatus CONT.

The control apparatus CONT supplies voltage for discharge control of the droplets to the droplet discharge head 1. Furthermore, the control apparatus CONT supplies drive pulse signals to the X axial direction drive motor 2 to control movement in the X axial direction of the droplet discharge head 1. In addition, the control apparatus CONT supplies drive pulse signals to the Y axial direction drive motor 3 to control movement of the stage 7 in the Y axial direction.

The cleaning mechanism 8 cleans the droplet discharge head 1, and is provided with a Y axial direction drive motor (not shown). As a result of the drive of this Y axial direction drive motor, the cleaning mechanism 8 is moved along the Y axial direction guide shaft 5. Movement of the cleaning mechanism 8 is also controlled by the control apparatus CONT.

The heater 15 in this case is an apparatus that performs heat processing on the substrate P using lamp annealing, and performs evaporation and drying of solvent contained in the ink coated on the substrate P. The turning on and off of the power source of this heater 15 is also controlled by the control apparatus CONT.

The droplet discharge apparatus IJ discharges droplets onto the substrate P while scanning the droplet discharge head 1 relatively to the stage 7 supporting the substrate P. Here, in the description given below, the Y axial direction is taken as the scanning direction, while the X axial direction, which is orthogonal to the Y axial direction, is taken as the non-scanning direction. Accordingly, the discharge nozzles of the droplet discharge head 1 are provided at fixed intervals in the X axial direction, which is the non-scanning direction. Note that, in FIG. 1, the droplet discharge head 1 is arranged perpendicularly to the direction of movement of the substrate P, however, it is possible to adjust the angle of the droplet discharge head 1 such that it intersects the direction of movement of the substrate P. If this mode is employed, then it is possible to adjust the pitch between the nozzles by adjusting the angle of the droplet discharge head 1. It is also possible to make the distance between the substrate P and the nozzle surface optionally adjustable.

Figure 2:
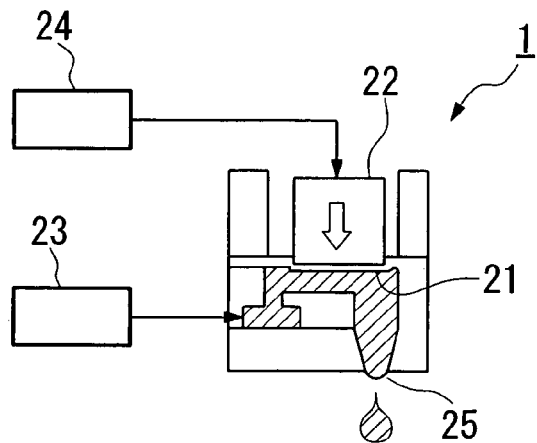
FIG. 2 is a view for describing the theory of the discharge of liquid material using a piezo electric method.

FIG. 2 is a view for describing the principle of discharging liquid material using a piezoelectric method.

In FIG. 2, a piezoelectric element 22 is provided adjacent to a liquid chamber 21 that stores a liquid material (e.g., an ink used for forming a wiring pattern or a functional liquid). Liquid material is supplied to the liquid chamber 21 via a liquid material supply system 23 that includes a liquid tank that stores the liquid material. The piezoelectric element 22 is connected to a drive circuit 24. When voltage is applied to the piezoelectric element 22 via this drive circuit 24 so as to deform the piezoelectric element 22, the liquid chamber 21 is deformed and liquid material is discharged from the discharge nozzle 25. In this case, the distortion amount of the piezoelectric element 22 is controlled by changing the value of the applied voltage. Moreover, the distortion speed of the piezoelectric element 22 is controlled by changing the frequency of the applied voltage. Because no heat is applied to the material when droplet discharge is performed by a piezoelectric method, this method has the advantage that it is difficult for the composition of the material to be affected.

Next, an embodiment of the method of forming a wiring pattern of the present invention will be described with reference made to the drawings.

Figure 3:
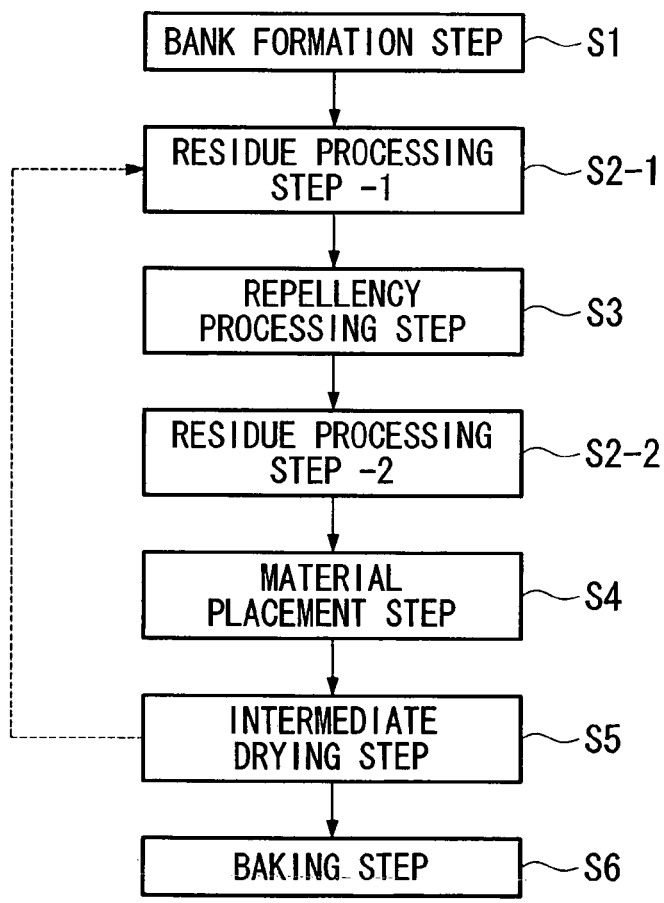
FIG. 3 is a flowchart showing an embodiment of the method of forming a thin film pattern of the present invention.

FIG. 3 is a flowchart showing an example of the method of forming a wiring pattern according to the present embodiment. FIG. 4A to FIG. 4D and FIG. 5A to FIG. 5D are typical views showing the formation procedure.

As is shown in FIG. 3, the method of forming a wiring pattern according to the present embodiment involves placing the above described wiring pattern formation ink on a substrate, and forming an electroconductive wiring pattern on the substrate. This method has a bank formation step S1 that forms banks in accordance with the wiring pattern on the substrate, a residue processing step S2 (S2-1 and S2-2) that removes residue between the banks, a repellency processing step S3 that imparts repellency to the banks, a material placement step S4 that places ink between banks from which residue has been removed, an intermediate drying step S4 that removes at least a portion of the liquid component of the ink, and a baking step S6.

Each step will now be described in detail. In the present embodiment a glass substrate is used for the substrate P.

(Bank Formation Step)

Figure 4A:
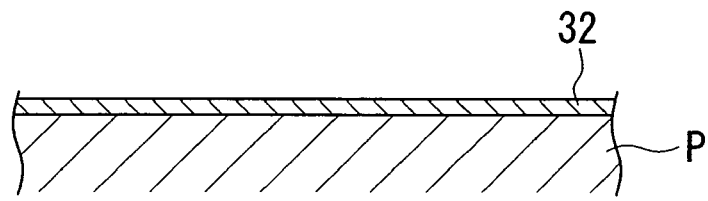
FIGS. 4A to 4D are typical views showing an example of a procedure of forming the thin film pattern of the present invention.

Firstly, as is shown in FIG. 4A, HMDS processing is performed on the substrate P as a surface improvement processing before the coating of the organic material. HMDS processing is a method in which hexamethyldisilane (($CH_3$)$_3$SiNHSi($CH_3$)$_3$)) is first vaporized and then coated. As a result, an HDMS layer 32 is formed on the substrate P in the form of an adhesive layer that improves the adhesion between the banks and the substrate P.

Figure 4B:
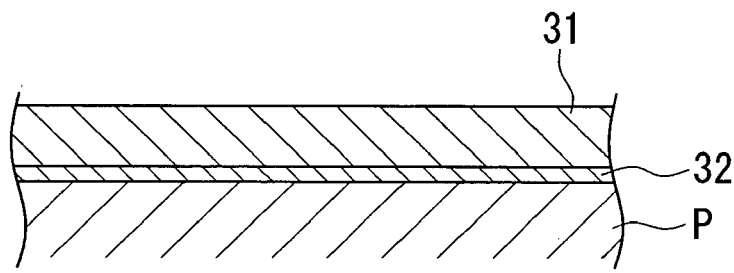
Figure 4C:
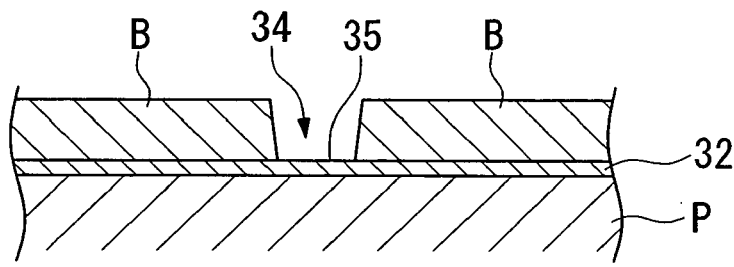

The banks are members that function as partitioning members. The banks can be formed by performing an optional method such as a photolithographic method or a printing method or the like. For example, if a photolithographic method is used, then using a predetermined method such as spin coating, spray coating, roll coating, die coating, or dip coating, as is shown in FIG. 4B, an organic photosensitive material 31 is coated on the HMDS layer 32 of the substrate P to match the height of the banks, and a resist layer is coated thereon. Next, a mask that matches the configuration of the banks (i.e., the wiring pattern) is applied and the resist is exposed and developed. As a result, resist that matches the configuration of the banks is left remaining. Finally, portions of the bank material other than the mask are removed by etching. It is also possible to form two or more layers of banks (i.e., convex portions) with the lower layer as an inorganic material or an organic material that exhibits lyophilic properties to the functional layer and the upper layer as an organic material that shows liquid repellency. As a result, as is shown in FIG. 4C, banks B and B are formed so as to enclose the periphery of the area where it is planned to form the wiring pattern.

As the organic material used to form the banks, a material that from the first exhibits repellency towards a liquid material may be used. Alternatively, as is described below, a non-conductive organic material that can be made liquid repellent by plasma processing (i.e., may be fluoridated) and that has excellent adhesion to the base substrate and is easily patterned by photolithography may be used. For example, high polymer materials such as acrylic resins, polyimide resins, olefin resins, phenol resins, and melamine resins may be used.

(Residue Processing Step—1)

Figure 4D:
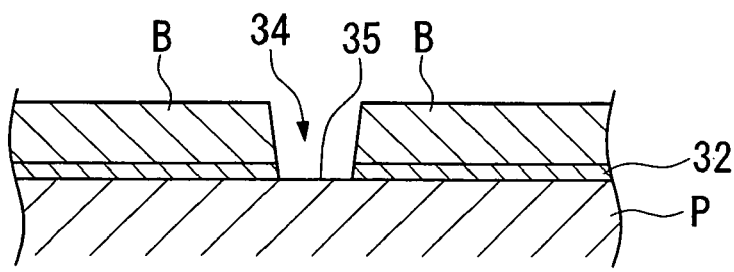

When the banks B and B are formed on the substrate P, fluoridation processing is performed. Fluoridation processing is processing in which, for example, the HMDS layer 32 is removed from between the banks B and B by performing etching using a 2.5% hydrofluoride water solution. In the fluoridation processing, with the banks B and B functioning as masks, the HMDS layer 32, which is an organic material, on the bottom portion 35 of the grooves 34 formed between the banks B and B is removed. As a result, as is shown in FIG. 4D, the residual HMDS is removed.

(Repellency Processing Step)

Next, repellency processing is performed on the banks B so that liquid repellency is imparted to the surfaces thereof. For the repellency processing, for example, a plasma processing method (i.e., a $CF_4$ plasma processing method) that uses tetrafluoromethane as a processing gas in an air atmosphere may be employed. The $CF_4$ plasma processing conditions may include, for example, a plasma power of 100 to 800 W, a carbon tetrafluoride gas flow rate of 50 to 100 mL/min, a substrate transporting speed relative to the plasma discharge electrode of 0.5 to 1020 mm/sec, and a substrate temperature of 70 to 90° C. Note that the processing gas is not restricted to tetrafluoromethane and other fluorocarbon based gases may be used.

By performing this type of repellency processing, a fluorine base is introduced into the resin constituting the banks B and B, and a high degree of repellency is imparted to the banks B and B. Note that the aforementioned $O_2$ plasma processing, which serves as lyophilization processing, may be performed before the formation of the banks B, however, because acrylic resins and polyimide resins and the like have the property that they are more easily fluoridated (i.e., made liquid repellent) if they have undergone $O_2$ plasma preprocessing, it is preferable that the $O_2$ plasma processing is performed after the formation of the banks B.

As a result of the repellency processing on the banks B and B, there are some small effects on exposed portions of the substrate P between the banks that have previously undergone lyophilization processing. However, in particular, if the substrate P is formed by glass or the like, the fluorine base is not introduced into the substrate P by the repellency processing so that, essentially, there is no harm to the lyophilic properties, namely, to the wettability of the substrate. In addition, by forming the banks B and B from a material having repellency (for example, a resin material having a fluorine base), it is possible for the repellency processing to be omitted.

(Residue Processing Step—2)

Here, in some cases, in the hydrofluoric acid processing, the HMDS (i.e., organic matter) of the bottom portion 35 between the banks B and B may not be completely removed. Alternatively, there are cases in which resist (i.e., organic matter) remains from the formation of the banks in the bottom portions 35 between the banks B and B. Therefore, next, residue processing is performed once more on the substrate P in order to remove organic matter (i.e., resist) residue left over from the bank formation in the bottom portions 35 between banks B and B.

In order that the repellency of the banks is not lowered too much, for the residue processing it is possible to select ultraviolet ray (UV) irradiation processing in which the residue processing is performed by the irradiation of ultraviolet rays, or $O_2$ plasma processing that employs oxygen as the processing gas in an air atmosphere, or the like.

It is also possible to select etching processing using acid ($H_2SO_4$, HF, $HNO_3$) or the like.

If the substrate P is a glass substrate, the surface thereof has lyophilic properties towards the material for forming the wiring pattern. However, as in the present embodiment, by performing $O_2$ plasma processing or ultraviolet ray irradiation processing in order to perform the residue processing, it is possible to raise the lyophilic properties of the surface (i.e., the bottom portions 35) of the substrate P that is exposed between the banks B and B. Here, it is preferable that $O_2$ plasma processing and ultraviolet ray irradiation processing, as well as etching using acid (i.e., HF) are performed in order that the contact angle of the bottom portions 35 between the banks to the ink is 15 degrees or less.

Figure 6A:
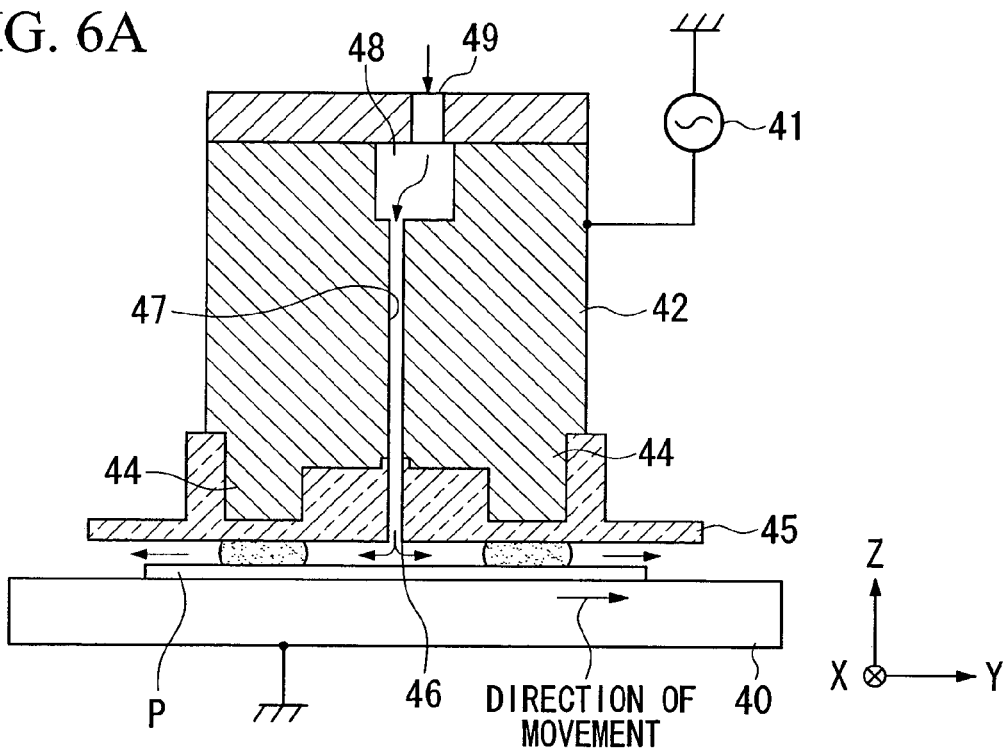
FIGS. 6A and 6B are views showing an example of a plasma processing apparatus used in a residue processing step.

FIG. 6A is a schematic structural view showing an example of a plasma processing apparatus used when performing $O_2$ plasma processing. The plasma processing apparatus shown in FIG. 6A has an electrode 42 that is connected to an ac power supply 41 and a specimen table 40 which is an earth electrode. The specimen table 40 is capable of moving in the Y axial direction while supporting the substrate P as a specimen. Two parallel discharge generating portions 44 and 44 that extend in the X axial direction which is orthogonal to the direction of movement are formed on a bottom surface of the electrode 42. In addition, a dielectric member 45 is provided on a bottom surface of the electrode 42 so as to enclose the discharge generating portions 44. The dielectric member 45 is provided in order to prevent anomalous discharge of the discharge generating portions 44. The bottom surface of the electrode 42 that includes the dielectric member 45 has a substantially planar configuration, and a slight space (i.e., a discharge gap) is formed between the discharge generating portions 44 and dielectric member 45 and the substrate P. In the center of the electrode 42 there is provided a gas injection nozzle 46 that constitutes a portion of a processing gas supply section that is formed in a narrow elongated shape extending in the X axial direction. The gas injection nozzle 46 is connected to a gas introduction aperture 49 via a gas passage 47 inside the electrode and an intermediate chamber 48.

A predetermined gas that contains processing gas injected from the gas injection nozzle 46 via a gas passage 47 is separated into a forward flow and a backward flow in the direction of movement (i.e., the Y axial direction) inside the space, and is expelled to the outside from the front end and the rear end of the dielectric member 45. At the same time as this, a predetermined voltage is applied from the power supply 41 to the electrode 42, and a gaseous discharge is generated between the discharge generating portions 44 and 44 and the specimen table 40. An active excitation form of the predetermined gas is created by the plasma generated by this gaseous discharge, and the entire surface of the substrate P that is passing through this discharge area undergoes continuous processing.

In the present embodiment, the predetermined gas is a mixture of oxygen ($O_2$) serving as processing gas, helium (He) in order to allow the discharge to commence easily at a pressure near to atmospheric pressure and also to maintain stability, a noble gas such as argon (Ar), and an inert gas such as nitrogen ($N_2$). In particular, by using oxygen as the processing gas, as was described above, removal (i.e., cleansing) of organic matter residue and lyophilization are performed. Moreover, by performing this $O_2$ plasma processing on, for example, an electrode in an organic EL apparatus, it is possible to adjust the work coefficient of this electrode.

Figure 6B:
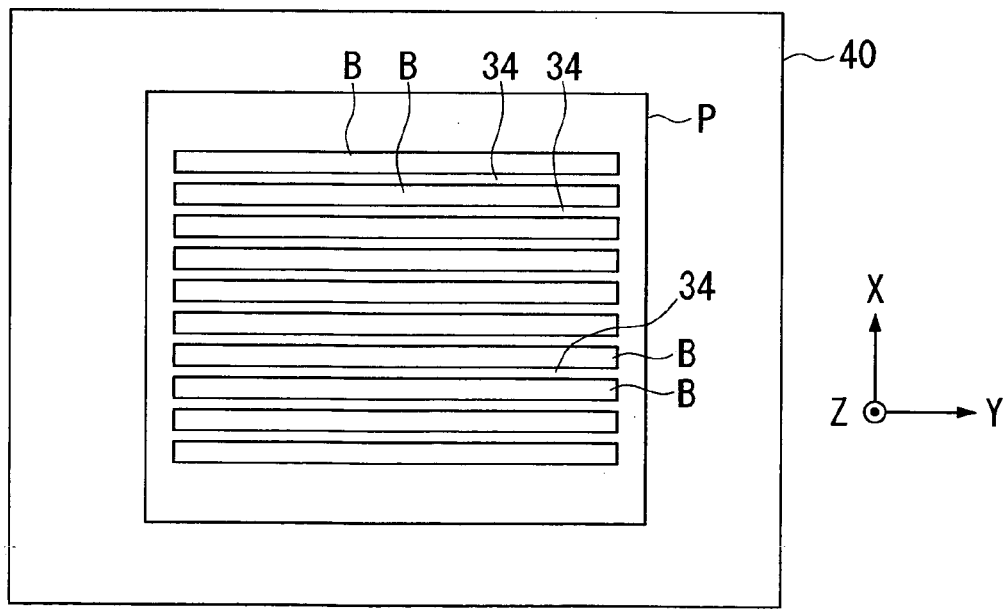

FIG. 6B is a view showing the substrate P supported on the specimen table 40.

In FIG. 6B, a plurality of banks and grooves 34 that are formed between the banks are formed extending in one direction (in this case, the Y axial direction) on the substrate P. A wiring pattern is formed having the Y axial direction as the longitudinal direction thereof in the groove portions 34 between these banks B and B. Moreover, in the present embodiment, $O_2$ plasma processing is performed on the substrate P where the banks B are formed in a state in which the direction in which the banks B extend (i.e., the Y axial direction) and the direction of movement of the specimen table 40 match each other. Namely, the plasma processing of the present embodiment is a structure that supplies the predetermined gas that contains processing gas while moving the substrate P in the Y axial direction, which is the direction in which the banks B extend. In other words, the plasma processing is performed in a state in which the direction in which the predetermined gas flows and the direction in which the banks B extend match each other. As a result, processing gas spreads smoothly over the bottom portions 35 between the banks B and B (i.e., over the exposed portions of the substrate P), and plasma processing can be performed uniformly.

Note that here a description is given of when the substrate P is moved, however, it is also possible to move the electrode 42 side that constitutes a portion of the processing gas supply section, and to move both the substrate P and the electrode 42 side.

Moreover, here, a description is given of when hydrofluoric acid processing is performed as part of the residue processing, however, if it is possible to sufficiently remove residue from the bottom portions 35 between the banks by $O_2$ plasma processing or by ultraviolet ray irradiation processing, then it is not necessary to perform the hydrofluoric acid processing. Furthermore, here, a description is given of when one of either $O_2$ plasma processing or ultraviolet ray irradiation processing is performed as the residue processing, however, naturally, it is also possible to perform a combination of both $O_2$ plasma processing and ultraviolet ray irradiation processing.

(Repellency Processing Step)

Next, repellency processing is performed on the banks B so that liquid repellency is imparted to the surfaces thereof. As the repellency processing, for example, it is possible to employ a plasma processing method (i.e., a $CF_4$ plasma processing method) that uses tetrafluoromethane as the processing gas in an air atmosphere. The $CF_4$ plasma processing conditions may include, for example, a plasma power of 100 to 800 W, a carbon tetrafluoride gas flow rate of 50 to 100 mL/min, a substrate transporting speed relative to the plasma discharge electrode of 0.5 to 1020 mm/sec, and a substrate temperature of 70 to 90° C. Note that the processing gas is not restricted to tetrafluoromethane and other fluorocarbon based gases may be used.

By performing this type of repellency processing, a fluorine base is introduced into the resin constituting the banks B and B, and a high degree of repellency is imparted to the banks B and B. Note that the aforementioned $O_2$ plasma processing, which serves as lyophilization processing, may be performed before the formation of the banks B, however, because acrylic resins and polyimide resins and the like have the property that they are more easily fluoridated (i.e., made liquid repellent) if they have undergone $O_2$ plasma preprocessing, it is preferable that the $O_2$ plasma processing is performed after the formation of the banks B.

As a result of the repellency processing on the banks B and B, there are some small effects on exposed portions of the substrate P between the banks that have previously undergone lyophilization processing. However, in particular, if the substrate P is formed by glass or the like, the fluorine base is not introduced into the substrate P by the repellency processing so that, essentially, there is no harm to the lyophilic properties, namely, to the wettability of the substrate. In addition, by forming the banks B and B from a material having repellency (for example, a resin material having a fluorine base), it is possible for the repellency processing to be omitted.

(Material Placement Step)

Figure 5A:
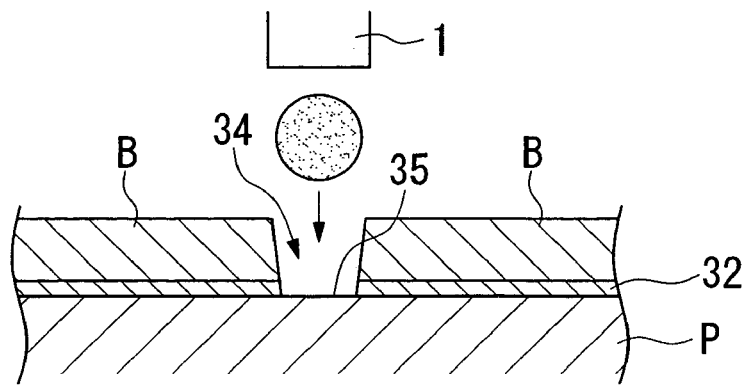
FIG. 5A to 5D are typical views showing an example of a procedure of forming the thin film pattern of the present invention.
Figure 5B:
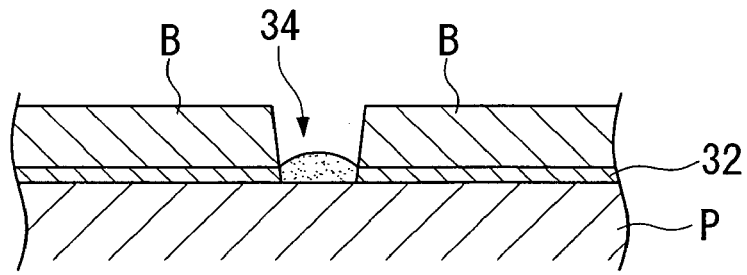

Next, using a droplet discharge method carried out by the droplet discharge apparatus IJ, droplets of ink used for forming a wiring pattern are placed between the banks B and B on the substrate P. Note that, here, an ink (i.e., the functional liquid) is discharged that is formed by an organosilver compound that uses an organosilver compound as the electroconductive material and uses diethylene glycol diethyl ether for the solvent (i.e., the dispersion medium). In the material placement step, as is shown in FIG. 5A, ink that contains the material for forming a wiring pattern is discharged in droplets from the droplet discharge head 1. As is shown in FIG. 5B, the discharged droplets are placed in the groove portions 34 between the banks B and B on the substrate P. As the droplet discharge conditions, for example, the ink weight may be 4 ng/dot and the ink speed (i.e., the discharge rate) may be 5 to 7 m/sec. Moreover, the atmosphere in which the droplets are discharged is preferably set to a temperature of 60° C. or less and a humidity of 80% or less. As a result, it is possible to perform a stable droplet discharge without the nozzles of the droplet discharge head 1 becoming blocked.

At this time, because the areas where it is planned to form the wiring pattern (namely, the groove portions 34) onto which the droplets are discharged are enclosed by the banks B and B, is possible to prevent the droplets from spreading to portions other than predetermined positions. Moreover, because repellency has been imparted to the banks B and B, even if a portion of the discharged droplets lands on a bank B, because the banks surface is liquid repellent the droplet is repelled from the bank B and runs down into the groove portions 34 between the banks. Furthermore, because lyophilic properties have been imparted to the bottom portions 35 of the groove portions 34 where the substrate P is exposed, discharged droplets are able to spread more easily on the bottom portions 35 resulting in the ink being placed uniformly within the predetermined positions.

(Intermediate Drying Step)

Figure 5C:
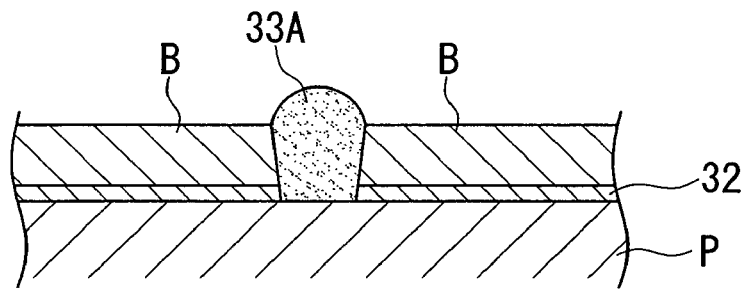

After the droplets have been discharged onto the substrate P, if necessary, drying processing is performed in order to remove the dispersion medium and ensure the film thickness. Drying processing can be performed, for example, using a normal hot plate that heats the substrate P, or by processing using an electric furnace or the like, as well as by lamp annealing. There is no particular restriction as to the light source of the light used for lamp annealing, however, as the light source it is possible to use an infrared lamp, a xenon lamp, a YAG laser an argon laser, a carbon gas laser, or an excimer laser such as XeF, XeCl, XeBr, KrF, KrCl, ArF, ArCl or the like. Typically, these light sources that are used have an output in the range of 10 W or more to 5000 W or less, however, in the present embodiment a range of between 100 W or more to 1000 W or less is sufficient. By repeatedly performing this intermediate drying step and the above described material placement step, as is shown in FIG. 5C, a plurality of layers of droplets of the liquid material are laminated and a wiring pattern (i.e., thin film pattern) 33A having a thick film thickness is formed.

(Baking Step)

After the discharge step, if the electroconductive material is, for example, an organosilver compound, in order to obtain electroconductivity it is necessary to perform heat processing so as to remove the organic component of the organosilver compound and leave the silver particles behind. For this reason, heat processing and/or light processing is performed on the substrate after the discharge step.

Figure 5D:
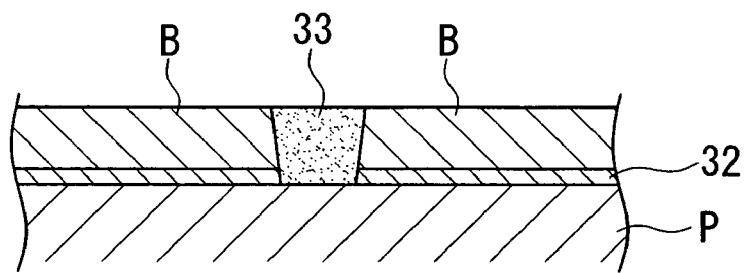

The heat processing and/or the light processing are performed in a normal atmosphere, however, if necessary, they can be performed in an atmosphere of an inert gas such as nitrogen, argon, helium, or the like. The processing temperature of the heat processing and/or the light processing may be appropriately set after considering the boiling point of the dispersion medium (i.e., the vapor pressure), the type and pressure of the atmospheric gas, thermal behavior such as the dispersibility of the fine particles and the oxidizability of the organosilver compound, whether or not a coating material is present and the quantity thereof, and the heat resistant temperature of the substrate. For example, in order to remove the organic component from the organosilver compound, is necessary for it to be baked at approximately 200° C. It is also preferable if a plastic substrate or the like is used to perform the processing at between room temperature or more and 100° C. or less. As a result of the above steps, as is shown in FIG. 5D, the electroconductive material (i.e., the organosilver compound) that has undergone the discharge step is converted into an electroconductive film (i.e., the wiring pattern) 33 by the remaining silver particles.

It should be noted that when a plurality of layers of ink droplets are laminated, it is possible after the first droplet has been discharged onto the substrate P, if necessary, to perform drying processing, and before the second droplet is discharged onto the substrate P to perform residue processing again. By performing residue processing before the second droplet is placed on top of the first droplet, even if the functional liquid adheres to the banks so that the repellency of the banks is deteriorated, residue of the functional layer, which is the cause of the repellency of the banks deteriorating, is removed. Accordingly, it is possible for the banks to exhibit the same properties as those before the subsequent droplets were laminated.

Note that after the baking step it is possible to remove the banks B and B present on the substrate P by ashing ablation processing. Plasma ashing or ozone ashing or the like can be employed for the ashing processing. Plasma ashing causes the banks (i.e., the resist) to react with a gas such as plasmified oxygen gas so as to vaporize the banks and allow them to be ablated and removed. The banks are solid substances formed from carbon, oxygen, and hydrogen, and by causing them to chemically react them with oxygen plasma they form $CO_2$, $H_2O$, and $O_2$ and can all be ablated in the form of a gas. The fundamental principle of ozone ashing is the same as that of plasma ashing. $O_3$ (ozone) is decomposed and changes to a reactive gas oxygen radical. This oxygen radical is then caused to react with the banks. The banks that have reacted with the oxygen radicals change to $CO_2$, $H_2O$, and $O_2$ and can all be ablated in the form of a gas. By performing ashing ablation processing on the substrate P the banks are removed from the substrate P.

As is described above, because the residue processing step S2 is provided in which the residue is removed, the generation of malfunctions such as bulges and broken wires caused by residue is suppressed, and it is possible to place the droplets of ink on the substrate P extremely favorably. Moreover, because a structure is employed in which the ink used to form the wiring pattern is placed in the groove portions 34 between the banks B and B that are formed on the substrate P, peripheral scattering of the discharged ink is prevented, and it is possible to form the wiring pattern smoothly and in a predetermined configuration that follows the bank configuration.

(Experiment Example)

A HMDS layer 32 was formed on the substrate P. Banks B were then formed thereon. Next, without hydrofluoric acid processing being performed, $O_2$ plasma processing was performed on the substrate P using the above described plasma processing apparatus. The processing conditions were set as a plasma power of 550 W, an oxygen gas flow rate of 100 mL/min, and a He gas flow rate of 10 L/min. The rate of movement of the specimen table 40 of the plasma processing apparatus were varied in sequence from 1 mm/sec to 2 mm/sec to 5 mm/sec. The contact angle between pure water and the bottom portions 35 (i.e. the exposed portions of the substrate P) between the banks after the $O_2$ plasma processing were then measured. As a result, it was found that, when the table movement rate was 1 mm/sec, a substrate in which the contact angle was approximately 59 degrees before the $O_2$ plasma processing was changed to a contact angle of 10 degrees or less after the $O_2$ plasma processing. In the same way, when the table movement rates were 2 mm/sec and 5 mm/sec, the contact angle was 10 degrees or less after the $O_2$ plasma processing. As a result of the above experiment, it was confirmed that the residue was sufficiently removed by performing $O_2$ plasma processing only without performing hydrofluoric acid processing, and also that uniform lyophilic properties were imparted to the substrate P (i.e., to the bottom portions 35).

(Electro-Optical Apparatus)

A description will now be given of a liquid crystal display apparatus, which is an example of the electro-optical apparatus of the present invention.

Figure 7:
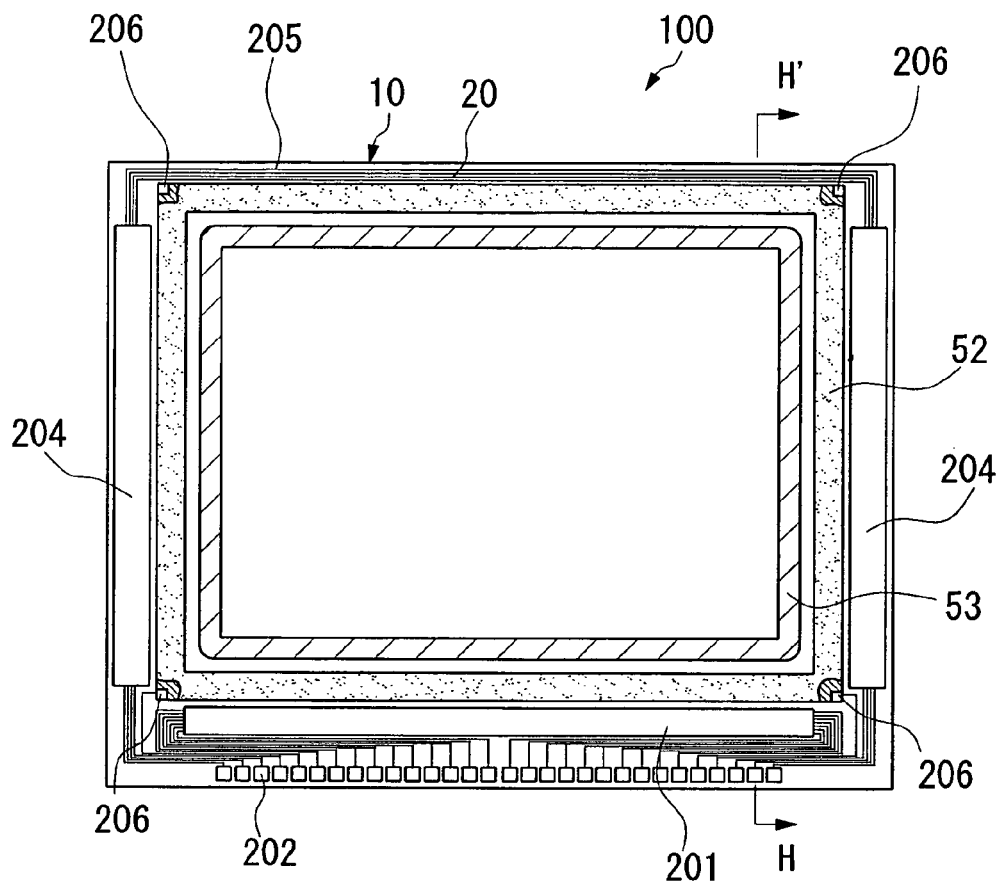
FIG. 7 is a plan view looking from a counter substrate side of a liquid crystal display apparatus.
Figure 8:
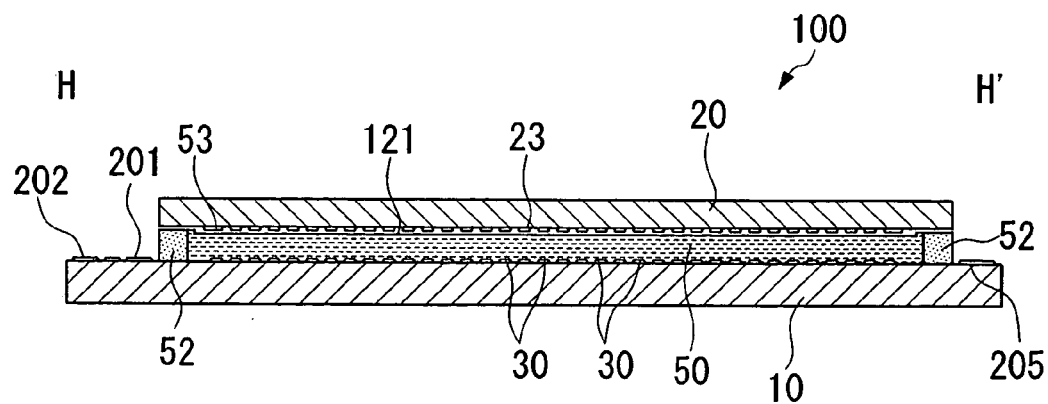
FIG. 8 is a cross-sectional view taken along the line H–H' in FIG. 7.
Figure 9:
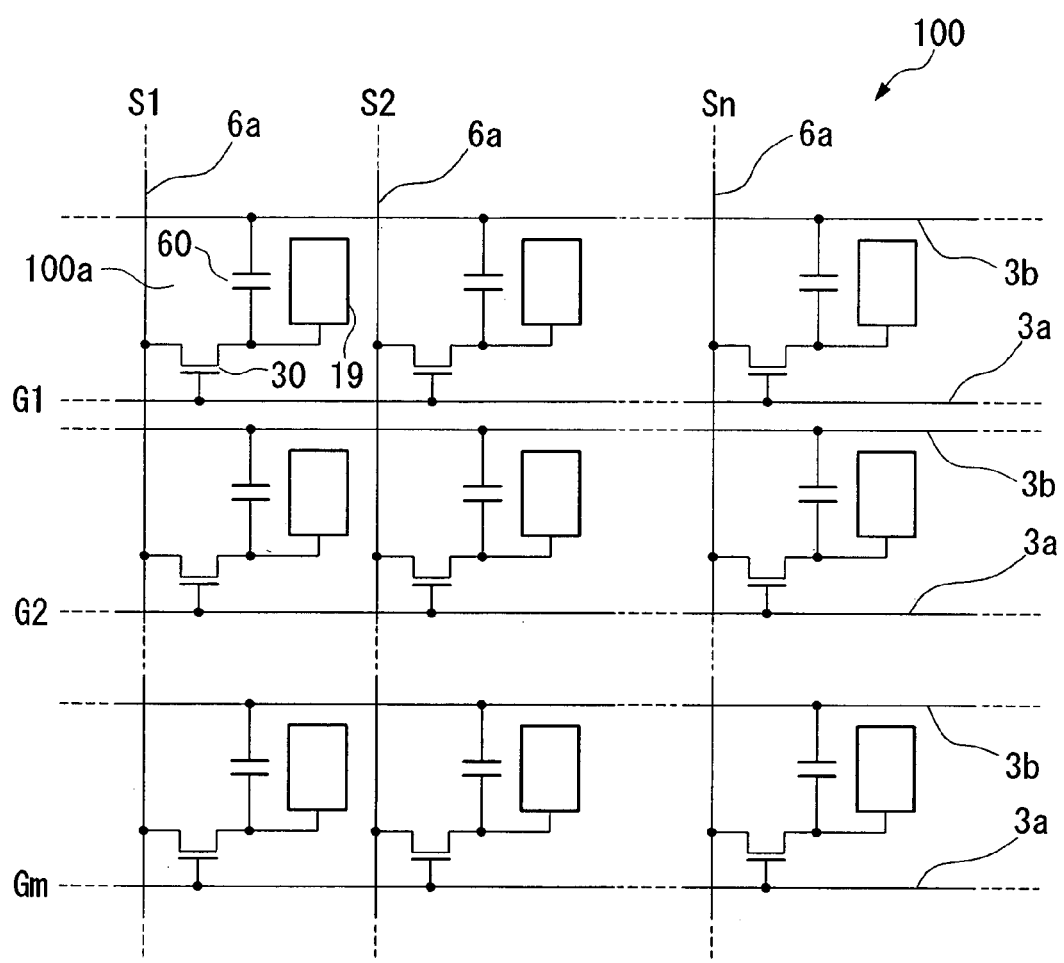
FIG. 9 is an equivalent circuit diagram of a liquid crystal display apparatus.
Figure 10:
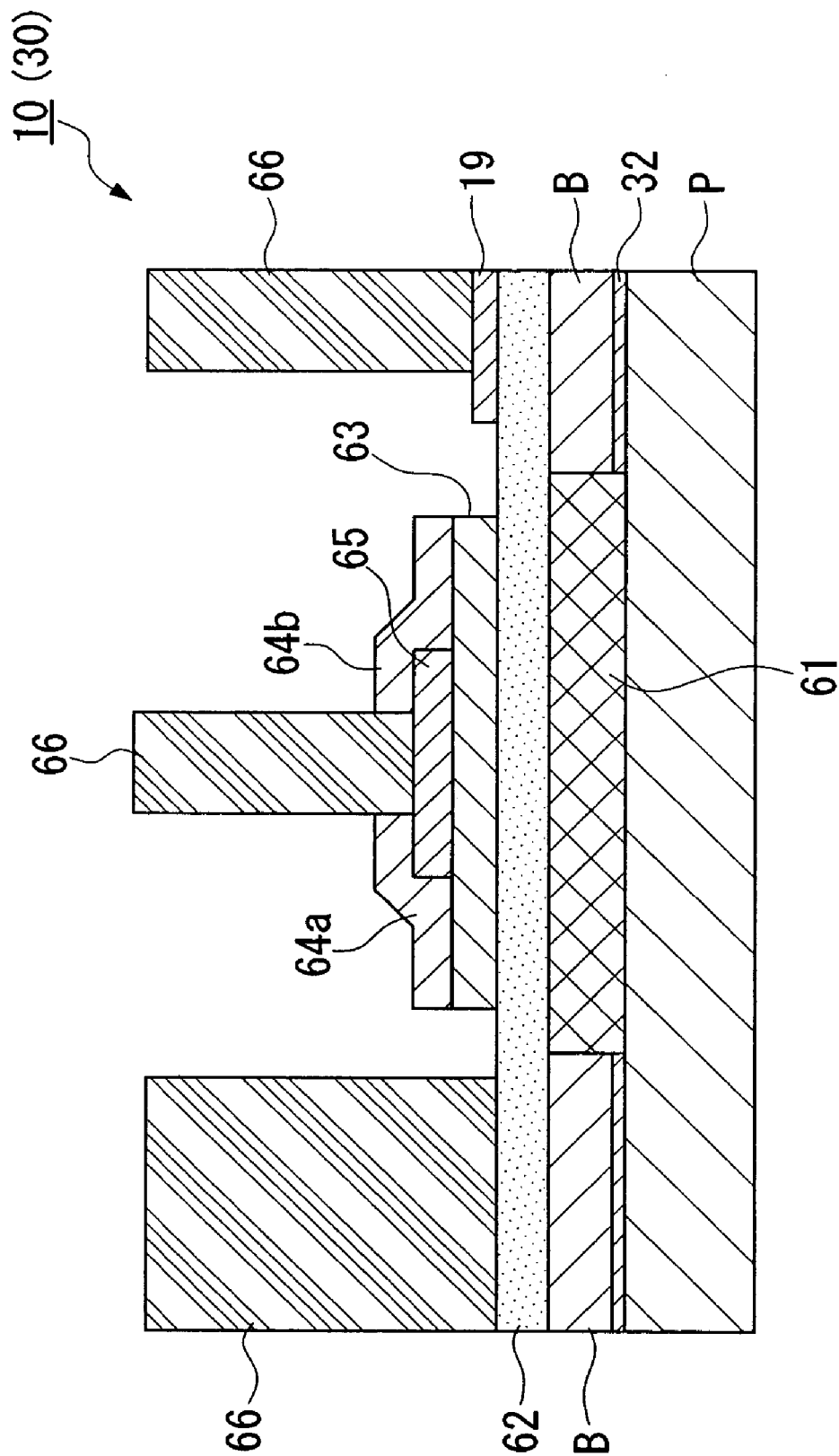
FIG. 10 is a partial enlarged cross-sectional view of a liquid crystal display apparatus.

FIG. 7 is a plan view as seen from a counter substrate side that is shown together with the respective component elements of the liquid crystal display apparatus according to the present invention. FIG. 8 is a cross-sectional view taken along the line H–H' in FIG. 7. FIG. 9 is an equivalent circuit diagram of various elements and wires and the like in a plurality of pixels that are formed in a matrix configuration in an image display area of the liquid crystal display apparatus. FIG. 10 is a partial enlarged cross-sectional view of the liquid crystal display apparatus. Note that, in each drawing used in the description given below, in order to make each layer and each member a sufficient size such that it can be recognized in the drawing, each layer and each member has a different scale.

In FIG. 7 and FIG. 8, in a liquid crystal display device (i.e., an electro-optical apparatus) 100 of the present embodiment, a TFT array substrate 10 and a counter substrate 20 that form a pair are adhered by a sealing member 52, which is a photocurable sealing member, and a liquid crystal 50 is enclosed and held within the area bounded by the sealing member 52. The sealing member 52 is formed as a closed frame in an area within the substrate surface.

A peripheral partition 53 formed from a light shielding material is formed in an area on the inner side of the area where the sealing member 52 is formed. A data wire drive circuit 201 and packaging terminals 202 are formed running along one side of the TFT array substrate 10 in an area on the outer side of the sealing member 52, and scan wire drive circuits 204 are formed along the two sides that are contiguous with the above one side. On the remaining side of the TFT array substrate 10 there are provided a plurality of wires 205 that connect together the scan wire drive circuits 204 that are provided on both sides of the image display area. In addition, in at least one location in a corner portion of the counter substrate 20 there is provided an inter substrate conductive material 206 that provides electrical conduction between the TFT array substrate 10 and the counter substrate 20.

Note that instead of forming the data wire drive circuit 201 and the scan wire drive circuit 204 on the TFT array substrate 10, it is also possible, for example, to electrically and mechanically connect a tape automated bonding (TAB) substrate on which is packaged a drive LSI to a terminal group formed in a peripheral portion of the TFT array substrate 10 via an anisotropic conductive film. Note also that, in the liquid crystal display apparatus 100, a phase differential plate, a polarization plate and the like is positioned in a predetermined orientation in accordance with the type of liquid crystal 50 that is used, namely, the operation mode such as a twisted nematic (TN) mode or super twisted nematic (STN) mode, or the distinction between a normally white mode and a normally black mode, however, here, these are omitted from the drawings. In addition, if the liquid crystal display apparatus 100 is formed for a color display, for example, red (R), green (G), and blue (B) color filters together with the protective films thereof are formed in areas of the counter substrate 20 that face the respective pixel electrodes (described below) of the TFT array substrate 10.

In the image display area of the liquid crystal display apparatus 100 having this type of structure, as is shown in FIG. 9, a plurality of pixels 100a are constructed in a matrix configuration. In addition, TFT 30 used for pixel switching (i.e., switching elements) are formed in each of the pixels 100a, and data wires 6a that supply pixel signals S1, S2, . . . , Sn are electrically connected to sources of the TFT 30. The pixel signals S1, S2, . . . , Sn that are written in the data wires 6a may be supplied line-sequentially in this sequence, or may be supplied to each one of groups formed by a plurality of mutually adjacent data wires 6a. Scan wires 3a are electrically connected to gates of the TFT 30, and scan signals G1, G2, . . . , Gm are applied line-sequentially in this sequence in pulses to the scan wires 3a at a predetermined timing.

Pixel electrodes 19 are electrically connected to a drain of the TFT 30, and by placing the TFT 30, which is a switching element, in an ON state for a predetermined period, the pixel signals S1, S2, . . . , Sn that are supplied from the data wires 6a may be written in each pixel at a predetermined timing. The pixel signals S1, S2, . . . , Sn having a predetermined level that are written in the liquid crystals via the pixel electrodes 19 in this manner are held for a fixed period between the pixel electrodes 19 and the counter electrodes 121 of the counter substrate 20 shown in FIG. 8. In order to prevent the held pixel signals S1, S2, . . . , Sn from leaking, storage capacitors 60 are added in parallel with liquid crystal capacitors that are formed between the pixel electrodes 19 and the counter electrodes 121. For example, the voltage of the pixel electrodes 19 is held by the storage capacitor 60 for a time 100 times longer than the time the source voltage is applied for. As a result, the holding properties of the charge are improved and a liquid crystal display apparatus 100 having a high contrast ratio can be achieved.

FIG. 10 is a partial enlarged cross-sectional view of the liquid crystal display apparatus 100 having a bottom gate type of TFT 30. A gate wire 61 is formed between the banks B and B on the glass substrate P constituting the TFT array substrate 10 by the wiring pattern formation method of the above described embodiment.

A semiconductor layer 63 formed by an amorphous silicon (a-Si) layer is stacked on the gate wire 61 via a gate insulating films 62 that is formed from SiNx. The portion of the semiconductor layer 63 facing this gate wire portion is formed as a channel area. Bonding layers 64a and 64b formed, for example, from an n$^+$ type a-Si layer are stacked on the semiconductor layer 63 in order to obtain an ohmic bond. A non-conductive etch-stop film 65 formed from SiNx that protects the channels is formed on the semiconductor layer 63 in a central portion of the channel areas. Note that the gate insulating film 62, the semiconductor layer 63, and the etch-stop film 65 are patterned in the manner shown in the drawing by performing chemical vapor deposition (CVD) and then performing resist coating, photosensitivity and developing processing, and photo etching.

Furthermore, the bonding layers 64a and 64b as well as the pixel electrode 19 that is formed from ITO are formed in the same manner, and by also performing photo etching thereon, they are patterned as is shown in the drawings. Next, respective banks 66 . . . are formed on the pixel electrode 19, the gate insulating film 62, and the etch-stop film 65, and using the above described droplet discharge apparatus IJ, droplets of a silver compound are discharged between the banks 66 . . . enabling source wires and drain wires to be formed.

In the above described embodiment, a structure is employed in which a TFT 30 is used as a switching element for driving the liquid crystal display apparatus 100, however, the structure can also be applied, for example, to organic electroluminescence (EL) display devices in addition to liquid crystal display apparatuses. Organic EL display devices have a structure in which a thin film that contains fluorescent inorganic and organic compounds is sandwiched by a cathode and an anode. Organic EL display devices generate excitons by injecting electrons and holes into the thin film so that they are recombined. Light is then generated using the discharge of light (i.e., fluorescence and phosphorescence) that occurs when these excitons are deactivated. From among the fluorescent materials used in an organic EL device, those materials that exhibit the respective red, green, and blue luminescent colors, namely, materials that form light emitting layers and materials that form hole injection/electron transporting layers are used as inks on a substrate having the aforementioned TFT 30. By patterning each of these it is possible to manufacture an independent light-emitting full color EL device. This type of organic EL device is included in the range of apparatuses of the present invention (i.e., electro-optical apparatuses).

Figure 11:
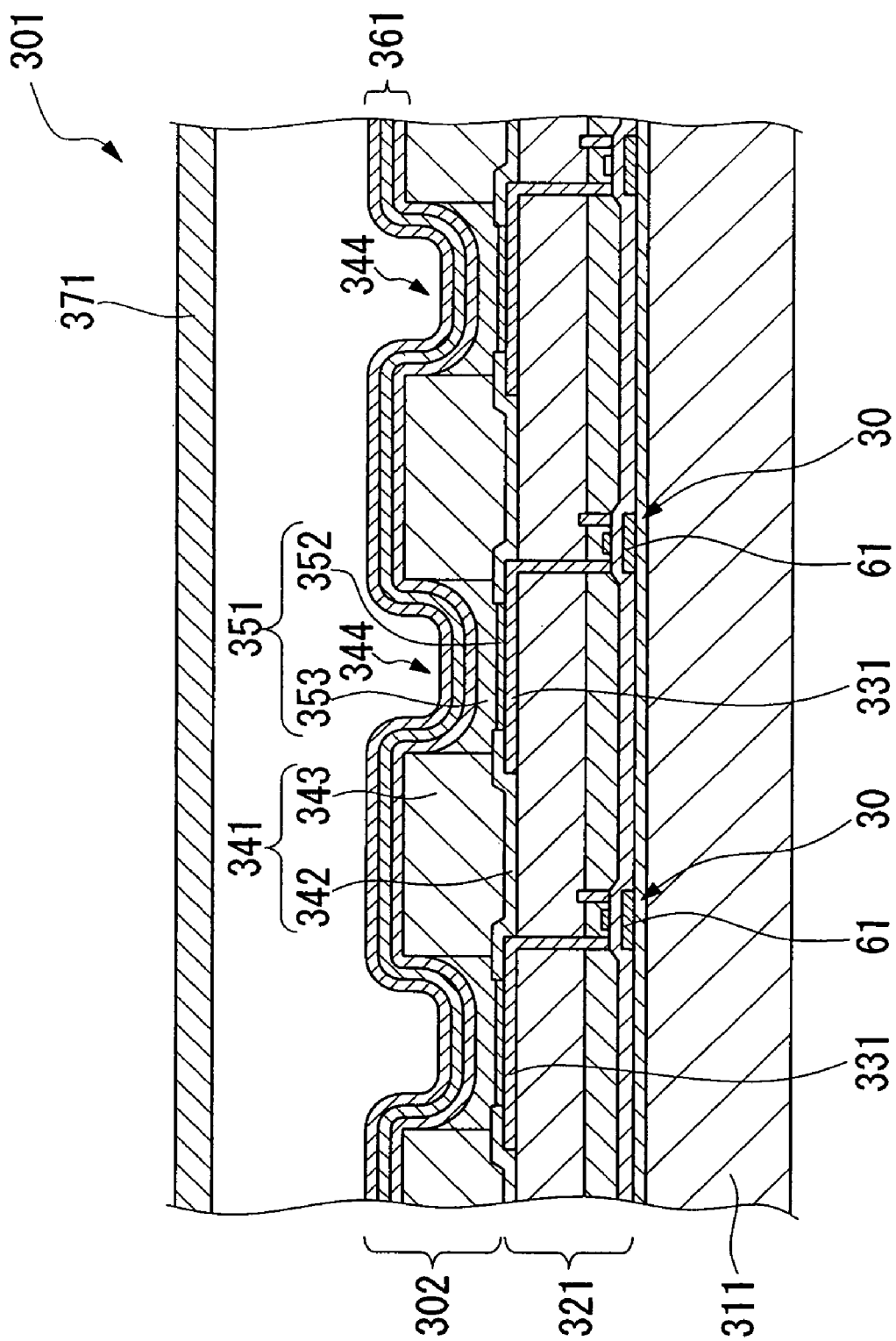
FIG. 11 is a partial enlarged cross-sectional view of an organic EL apparatus.

FIG. 11 is a side cross-sectional view of an organic EL apparatus in which a portion of the component elements have been manufactured using the above described droplet discharge apparatus IJ. The schematic structure of this organic EL apparatus will be described with reference made to FIG. 11.

In FIG. 11, in an organic EL apparatus 301, the wires of a flexible substrate (not shown) and a drive IC (not shown) are connected to an organic EL device 302 that is formed by a substrate 311, a circuit element section 321, pixel electrodes 331, bank portions 341, light emitting elements 351, a cathode 361 (i.e., a counter electrode), and a sealing substrate 371. The circuit element section 321 is constructed by forming a TFT 30, which is an active element, on the substrate 311, and then aligning a plurality of pixel electrodes 331 on the circuit element section 321. A gate wire 61 that constitutes the TFT 30 is formed using the wiring pattern formation method of the above described embodiment.

The bank portions 341 are formed in a matrix configuration between each of the pixel electrodes 341. The light emitting elements 351 are formed in concave apertures 344 created by the bank portions 341. Note that the light emitting elements 351 are formed by elements that emit red light, elements that emit green light, and elements that emit blue light and, as a result, the organic EL apparatus 301 is able to achieve a full-color display. The cathode 361 is formed over the entire top surface of the bank portions 341 and the light emitting elements 351, and the sealing substrate 371 is laminated on top of the cathode 361.

The manufacturing process of the organic EL apparatus 301 that includes an organic EL device is provided with a bank portion formation step in which the bank portions 341 are formed, a plasma processing step for allowing the light emitting elements 351 to be suitably formed, a light emitting element formation step in which the light emitting elements 351 are formed, a counter electrode formation step in which the cathode 361 is formed, and a sealing step in which the sealing substrate 371 is laminated on the cathode 361 thereby sealing it.

In the light emitting element formation step, the light emitting elements 351 are formed by forming a hole injection layer 352 and a light emitting layer 353 on the concave apertures 344, namely, on the pixel electrodes 331. The light emitting element formation step is consequently provided with a hole injection layer formation step and a light emitting layer formation step. The hole injection layer formation step has a first discharge step in which a liquid material used to form the hole injection layer 352 is discharged onto each pixel electrode 331, and a first drying step in which the discharged liquid material is dried so as to form the hole injection layer 352. The light emitting layer formation step has a second discharge step in which a liquid material used to form the light emitting layer 353 is discharged onto the hole injection layer 352, and a second drying step in which the discharged liquid material is dried so as to form the light emitting layer 353. Note that three types of light emitting layer 353 are formed using material corresponding to the three colors of red, green, and blue, as is described above. Accordingly, the second discharge step includes three steps for respectively discharging the three types of material.

In this light emitting element formation step, is possible to use the droplet discharge apparatus IJ in the first discharge step in the hole injection layer formation step and in the second discharge step in the light emitting layer formation step.

Moreover, in the above described embodiment, the gate wires of the TFT (i.e., the thin film transistor) are formed using the pattern formation method according to the present invention, however, it is also possible to manufacture other component elements such as source electrodes, drain electrodes, and pixel electrodes using the pattern formation method according to the present invention. A description will now be given of a method of manufacturing a TFT with reference made to FIG. 12 through FIG. 15.

Figure 12:
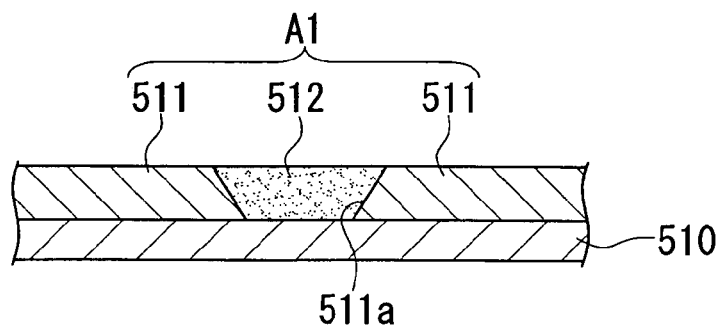
FIG. 12 is a view for describing a step of manufacturing a thin film transistor.

As is shown in FIG. 12, firstly, a first bank 511 for providing a groove 511a, which is $\frac{1}{20}^{th}$ to $\frac{1}{10}^{th}$ the pitch of a single pixel, is formed based on a photolithographic method on a top surface of a cleaned glass substrate 510. Because it is necessary to provide the bank 511 with optical transparency and repellency after it is formed, in addition to a high polymer material such as an acrylic resin, a polyimide resin, an olefin resin and a melamine resin, an inorganic based material such as polysilazane is preferably used for the material of the bank 511.

In order to furnish the formed bank 511 with repellency, it is necessary to perform $CF_4$ plasma processing or the like (i.e., plasma processing that uses a gas having a fluoride component), however, instead of this, it is also possible to fill the material itself of the bank 511 in advance with a repellency component (i.e., a fluorine group or the like). In this case, it is possible to omit the $CF_4$ plasma processing or the like.

It is preferable that the contact angle of the bank 511, which has undergone repellency processing as is described above, to the discharged bank is 40° or more, while the contact angle of the glass surface is preferably secured at 10° or less. Namely, the results confirmed by the present inventors in experiments showed that it is possible after processing to secure a contact angle relative to, for example, electroconductive fine particles (i.e., a tetradecane solvent) of approximately 54.0° (compared to 10° or less without processing) when an acrylic based resin is used as the material for the bank 511. Note that these contact angles were obtained under processing conditions of a plasma power of 550 W, with tetrafluoromethane gas supplied at a flow rate of 0.1 L/min.

In a gate scan electrode formation step (i.e., a first electroconductive pattern formation step) that follows the above described first bank formation step, a gate scan electrode 512 is formed by discharging droplets containing an electroconductive material using an inkjet such that they fill the interior of the groove 511a, which is the drawing area bounded by the bank 511. The pattern forming method according to the present invention is applied when the gate scan electrode 512 is being formed.

As the electroconductive material used at this time, Ag, Al, Au, Cu, Pd, Ni, W-si, electroconductive polymers and the like may be favorably employed. Because sufficient repellency has been imparted in advance to the bank 511, the gate scan electrode 512 that has been formed in this manner does not protrude from the groove 511a and it is possible to form a precise, minute wiring pattern.

As a result of the above steps, a first electroconductive layer Al that is formed from silver (Ag) and is provided with a flat top surface that is formed by the bank 511 and the gate scan electrode 512 is formed on top of the substrate 510.

In order to obtain excellent discharge results in the groove 511a, as is shown in FIG. 12, it is preferable that a quasi-taper (namely, a taper configuration that opens out in the direction facing the discharge source) is employed as the configuration of the groove 511a. As a result, discharged droplets are able to penetrate to a sufficient depth.

Figure 13:
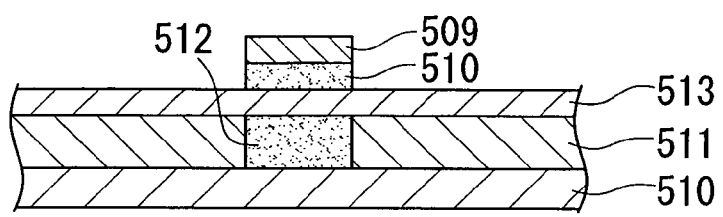
FIG. 13 is a view for describing a step of manufacturing a thin film transistor.

Next, as is shown in FIG. 13, the formation of a gate insulating film 513, an active layer 510, and a contact layer 509 is performed consecutively using a plasma CVD method. By changing the raw material gas and the plasma conditions, a silicon nitride film is formed as the gate insulating film 513, an amorphous silicon film is formed as the active layer 510, and a n$^+$ silicon film is formed as the contact layer 509. When these are formed using a CVD method, a heat history of 300° C. to 350° C. is necessary, however, by using an inorganic material for the bank, it is possible to avoid problems relating to transparency and heat resistance.

Figure 14:
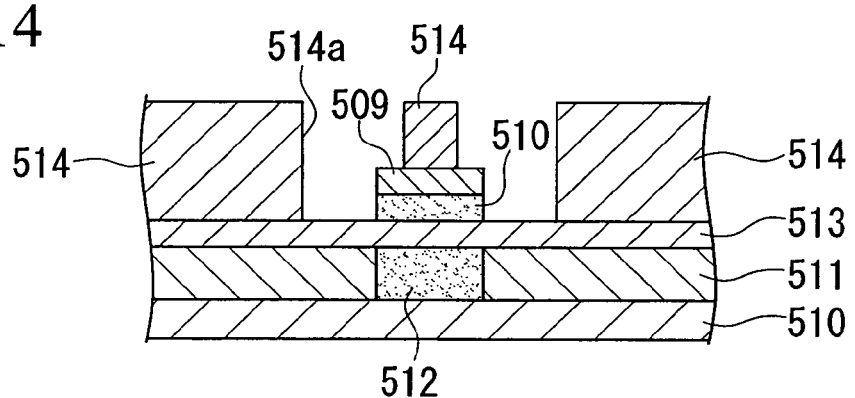
FIG. 14 is a view for describing a step of manufacturing a thin film transistor.

In the second bank formation step that follows the above described semiconductor layer formation step, as is shown in FIG. 14, a second bank 514 for providing a groove 514a, which is $\frac{1}{20}^{th}$ to $\frac{1}{10}^{th}$ the pitch of a single pixel and intersects the groove 511a, is formed based on a photolithographic method on a top surface of the gate insulating film 513. Because it is necessary to provide the bank 514 with optical transparency and repellency after it is formed, in addition to a high polymer material such as an acrylic resin, a polyimide resin, an olefin resin and a melamine resin, an inorganic based material such as polysilazane is preferably used for the material of the bank 511.

In order to furnish the formed bank 514 with repellency, it is necessary to perform CF$_4$ plasma processing or the like (i.e., plasma processing that uses a gas having a fluoride component), however, instead of this, it is also possible to fill the material itself of the bank 514 in advance with a repellency component (i.e., a fluorine group or the like). In this case, it is possible to omit the CF$_4$ plasma processing or the like.

It is preferable that the contact angle of the bank 514, which has undergone repellency processing as is described above, to the discharged bank is secured at 40° or more.

Figure 15:
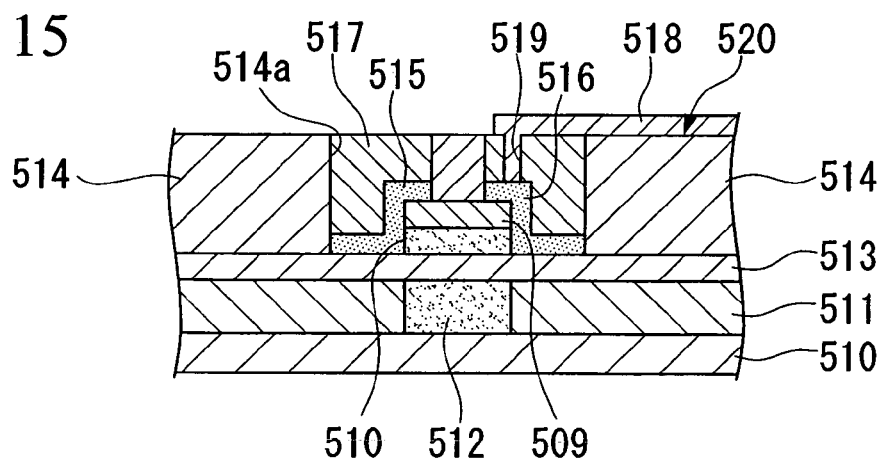
FIG. 15 is a view for describing a step of manufacturing a thin film transistor.

In a source—drain electrode formation step (i.e., a second electroconductive pattern formation step) that follows the above described second bank formation step, a source electrode 515 and a drain electrode 516 that intersect the gate scan electrode 512, as is shown in FIG. 15, are formed by discharging droplets containing an electroconductive material using an inkjet such that they fill the interior of the groove 514a, which is the drawing area bounded by the bank 514. The pattern forming method according to the present invention is applied when the source electrode 515 and the drain electrode 516 are being formed.

As the electroconductive material used at this time, Ag, Al, Au, Cu, Pd, Ni, W-si, electroconductive polymers and the like may be favorably employed. Because sufficient repellency has been imparted in advance to the bank 514, the source electrode 515 and the drain electrode 516 that have been formed in this manner do not protrude from the groove 511a and it is possible to form a precise, minute wiring pattern.

An insulating material 517 is then put in place so as to fill the groove 514a where the source electrode 515 and the drain electrode 516 have been placed. As a result of these steps, a flat top surface 520 that is formed by the bank 514 and the insulating material 517 is formed on top of the substrate 510.

A contact hole 519 is then formed in the insulating material 517 and a patterned pixel electrode (ITO) 518 is formed on the top surface 520. A TFT is then formed by connecting the drain electrode 516 and the pixel electrode 518 via the contact hole 519.

Figure 16:
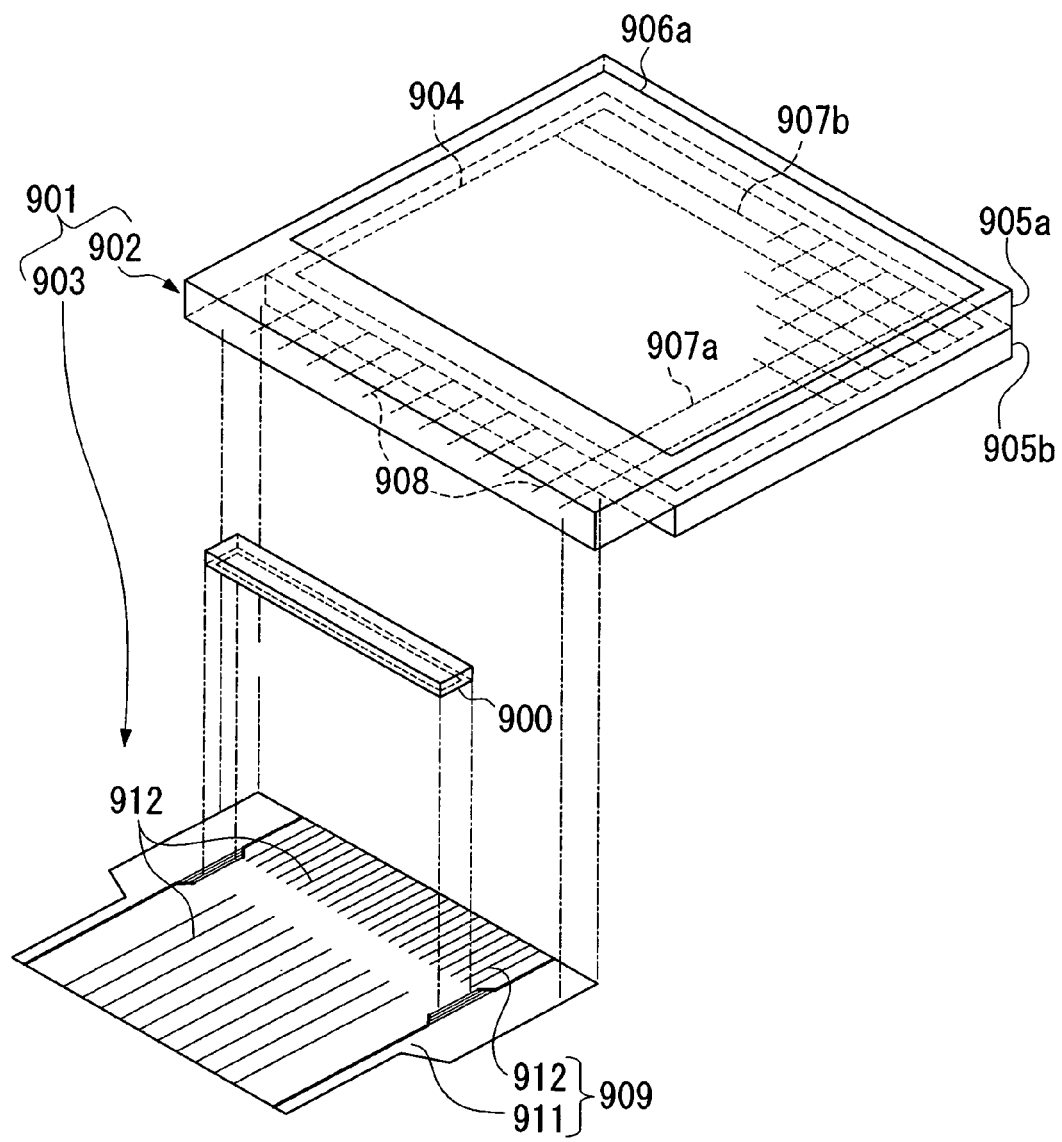
FIG. 16 is a view showing a different mode of a liquid crystal display apparatus.

FIG. 16 is a view showing another embodiment of a liquid crystal display device.

Broadly speaking, a liquid crystal display device (i.e., an electro-optical apparatus) 901 shown in FIG. 16 is provided with a color liquid crystal panel (i.e., an electro-optic panel) 902 and a circuit substrate that is connected to the liquid crystal panel 902. If necessary, an illumination device such as a backlight and other peripheral equipment may be added to the liquid crystal panel 902.

The liquid crystal panel 902 has a pair of substrates 905a and 905b that are adhered by a sealing member 904, and liquid crystal is filled into the gap formed between the substrate 905a and the substrate 905b, which is known as a cell gap. The substrate 905a and the substrate 905b are typically formed using a translucent material such as, for example, glass, synthetic resin or the like. A polarizing plate 906a and a polarizing plate 906b are adhered to outer surfaces of the substrate 905a and the substrate 905b. Note that, in FIG. 16, the polarizing plate 906b is omitted from the drawing.

An electrode 907a is formed on an inner surface of the substrate 905a and an electrode 907b is formed on an inner surface of the substrate 905b. The electrodes 907a and 907b are formed in a stripe configuration or in another suitable pattern such as in characters or numbers. The electrodes 907a and 907b are formed from a translucent material such as, for example, ITO (indium tin oxide). The substrate 905a has a protruding portion that protrudes beyond the substrate 905b, and a plurality of terminals 908 are formed on this protruding portion. The terminals 908 are formed at the same time as the electrode 907a when the electrode 907a is formed on the substrate 905a. Accordingly, the terminals 908 may be formed from, for example, ITO. A portion that extends integrally from the electrode 907a and a portion that is connected to the electrode 907b via an electroconductive material (not shown) are included in the terminals 908.

In the circuit substrate 903, a semiconductor element 900 serving as a liquid crystal drive IC is packaged at a predetermined position on the wiring substrate 909. Note that although omitted from the drawing, resistors, condensers and other chip components may be packaged at predetermined positions other than the position where the semiconductor element 900 is packaged. The wiring substrate 909 may be manufactured by forming a wiring pattern 912 by patterning a metal film such as Cu or the like that is formed on a base substrate 911 having flexibility such as, for example, a polyimide substrate.

In the present embodiment, the electrodes 907a and 907b in the liquid crystal panel 902 and the wiring pattern 912 in the circuit substrate 903 are formed by the above described device manufacturing method.

According to the liquid crystal display device of the present embodiment, it is possible to obtain a high-quality liquid crystal display device from which non-uniformity in the electrical characteristics has been removed.

Note that the above described example is one of a passive liquid crystal panel, however, an active matrix type of liquid crystal panel may also be used. Namely, thin film transistors (TFT) are formed on one substrate, and pixel electrodes are formed for each TFT. It is also possible to form the wires (i.e., the gate wires and source wires) electrically connecting each TFT using the above described inkjet technology. Counter electrodes and the like are formed on the opposing substrate. The present invention can also be applied to this type of active matrix type of liquid crystal panel.

An embodiment of a non-contact type of card medium will now be described as another embodiment.

Figure 17:
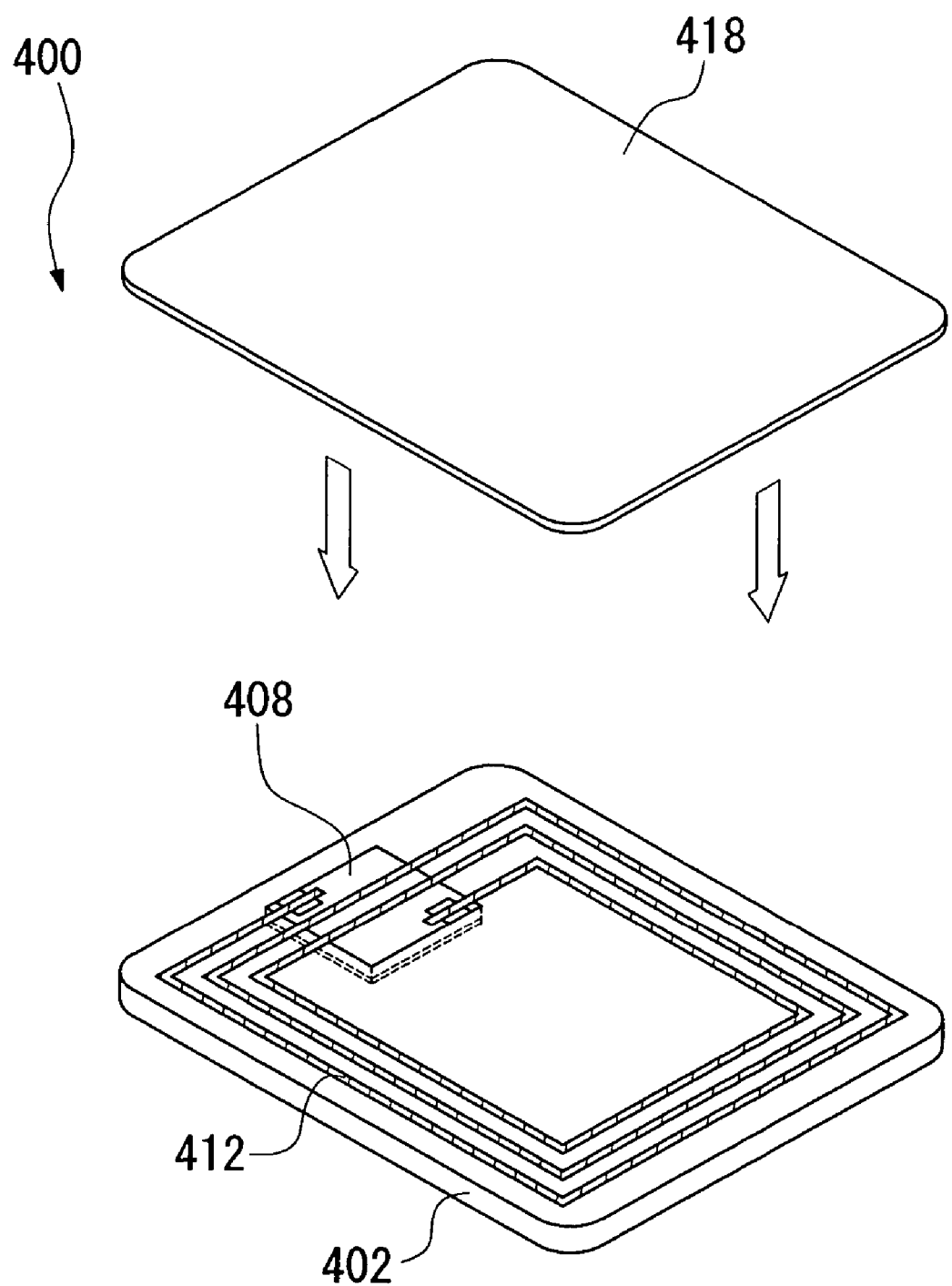
FIG. 17 is an exploded perspective view of a non-contact card medium.

As is shown in FIG. 17, a non-contact type of card medium (i.e., an electronic apparatus) 400 according to the present embodiment incorporates a semiconductor integrated circuit chip 408 and an antenna circuit 412 inside a housing formed by a card substrate 402 and a card cover 418. At least one of the supply of power and the transfer of data is carried out by an external transceiver (not shown) and at least one of electromagnetic waves and capacitance coupling. In the present embodiment, the aforementioned antenna circuit 412 is formed using the wiring pattern formation method according to the above described embodiment.

Note that, as the device (i.e., the electro-optical apparatus) according to the present invention, in addition to that described above, the present invention may also be applied to plasma display panels (PDP) and surface conduction electronic emission elements that utilize the phenomenon that electronic emissions can be generated by supplying a current in parallel to the film surface of a thin film having a small surface area that is formed on a substrate.

(Electronic Apparatus)

Specific examples of electronic apparatuses of the present invention will now be described.

Figure 18A:
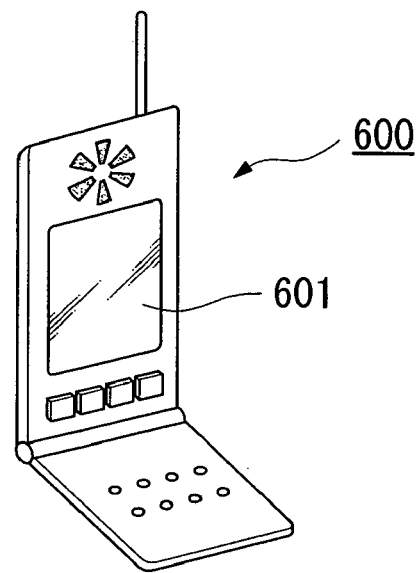
FIGS. 18A to 18C are views showing specific examples of electronic apparatuses of the present invention.

FIG. 18A is a prospective view showing an example of a mobile telephone. In FIG. 18A, 600 indicates a mobile phone body, and 601 indicates a liquid crystal display portion that is provided with the liquid crystal display apparatus of the above described embodiment.

Figure 18B:
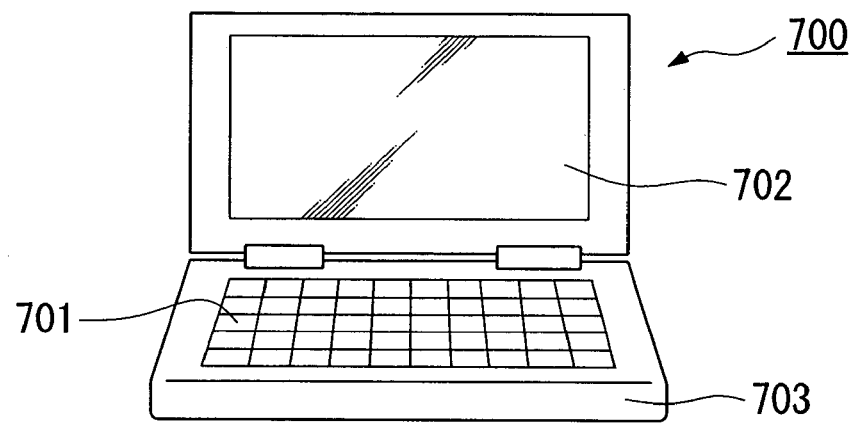

FIG. 18B is a prospective view showing an example of a portable information processing device such as a word processor or personal computer. In FIG. 18B, 700 indicates an information processing apparatus, 701 indicates an input section such as a keyboard, 703 indicates an information processing body, and 702 indicates a liquid crystal display portion that is provided with the liquid crystal display apparatus of the above described embodiment.

Figure 18C:
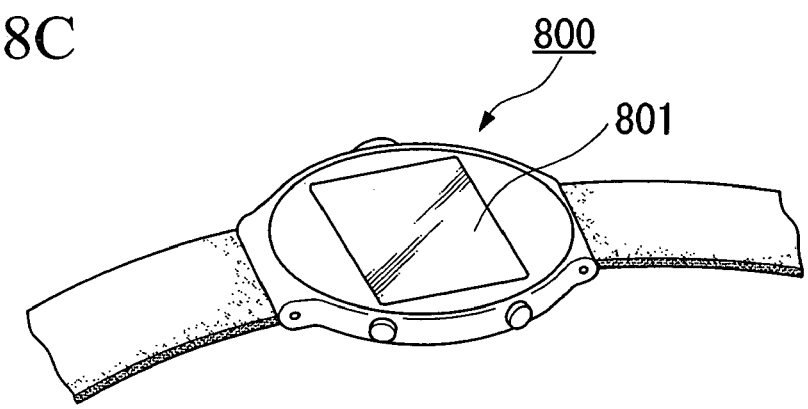

FIG. 18C is a prospective view showing an example of a wristwatch type of electronic apparatus. In FIG. 18C, 800 indicates a watch body, and 801 indicates a liquid crystal display portion that is provided with the liquid crystal display apparatus of the above described embodiment.

The electronic apparatuses shown in FIG. 18A to 18C are provided with the liquid crystal display device of the above described embodiment and the generation of malfunctions such as broken wires is suppressed.

Note that the electronic apparatus of the present embodiment is provided with a liquid crystal display apparatus, however, the electronic apparatus may also be provided with another electro-optical apparatus such as an organic electroluminescence display apparatus and a plasma display apparatus.

Favorable embodiments of the present invention have been described above with reference made to the attached drawings, however, it is to be understood that the present invention is not limited to these examples. The various configurations and combinations of the respective component elements shown in the above embodiments are simply examples, and various modifications may be made based on design requirements and the like insofar as they do not depart from the scope of the present invention.

For example, in the above described embodiments, a description is given of when banks are formed and residue between the banks is removed, however, the present invention is not limited to this, and it is also possible to employ a structure in which, for example, lyophilization processing is performed on the area where it is planned to form the wiring pattern by performing surface processing on the substrate, and repellency processing is performed on other portions and residue in the portions that have undergone lyophilization processing is removed. A desired wiring pattern can then be formed by placing an ink that contains electroconductive fine particles and organosilver compound in the portions that have undergone lyophilization processing.

Furthermore, in the above described embodiments, a structure is employed in which the thin film pattern is an electroconductive film, however, the present invention is not limited to this and it is also possible, for example, to apply the present invention to color filters used for colorizing display images in a liquid crystal display apparatus. These color filters can be formed by placing droplets of red, green, and blue inks (i.e., liquid materials) in a predetermined pattern on a substrate, however, it is possible to manufacture a liquid crystal display apparatus having high-performance color filters by forming color filters by forming banks in accordance with a predetermined pattern on a substrate, removing residue within groove portions formed between these banks, and then placing an ink therein.

What is claimed is:

1. A method of forming a thin film pattern by placing a functional liquid on a substrate, comprising:
    a bank formation step of forming banks in accordance with the thin film pattern on the substrate;
    a residue processing step of removing residue between the banks; and
    a material placement step of placing the functional liquid between the banks removed the residue,
        wherein the residue processing step comprises a photo irradiation processing step.

2. A method of forming a thin film pattern according to claim 1, wherein the residue processing step comprises a step of removing residue in bottom portions between the banks.

3. A method of forming a thin film pattern according to claim 1, further comprising a repellency processing step of imparting repellency to the banks after the residue processing step.

4. A method of forming a thin film pattern according to claim 3, further comprising a step of removing residue from bottom portions between the banks after the repellency processing step of imparting repellency to the banks.

5. A method of forming a thin film pattern according to claim 4, wherein the residue processing step that is performed after the repellency processing step comprises a step of removing residue from bottom portions between the banks.

6. A method of forming a thin film pattern according to claim 4, wherein the residue processing step that is performed after the repellency processing step comprises a photo irradiation processing step.

7. A method of forming a thin film pattern according to claim 4, wherein the residue processing step that is performed after the repellency processing step comprises a plasma processing step that uses a predetermined processing gas.

8. A method of forming a thin film pattern according to claim 4, wherein the residue processing step that is performed after the repellency processing step comprises a plasma processing step that uses a predetermined processing gas and a photo irradiation processing step.

9. A method of forming a thin film pattern according to claim 4, wherein the residue processing step performs etching using acid.

10. A method of forming a thin film pattern according to claim 1, wherein the residue processing step is performed once again after the material placement step.

11. A method of forming a thin film pattern according to claim 1, wherein the functional liquid exhibits electroconductivity after undergoing heat processing or light processing.

12. A method of forming a thin film pattern according to claim 1, wherein the functional liquid contains electroconductive fine particles.

13. A method of manufacturing an active matrix substrate comprising:
a first step of forming a gate wire on a substrate;
a second step of forming a gate insulating film on the gate wire;
a third step of laminating a semiconductor layer via the gate insulating film;
a fourth step of forming a source electrode and drain electrode on the gate insulating film;
a fifth step of placing a non-conductive material on the source electrode and the drain electrode;
a sixth step of forming a pixel electrode after the placement of the insulating material,
wherein at least one of the first, fourth, and sixth steps further comprising:
a bank forming step of forming banks to correspond to a formation pattern;
a residue processing step of removing residue between the banks; and
a material placement step of placing a functional material between the banks removed the residue by being discharged using a droplet discharge apparatus,
wherein the residue processing step comprises a photo irradiation processing step.

14. A method of manufacturing an active matrix substrate according to claim 13, further comprising a repellency processing step of imparting repellency to the banks after the residue processing step.

15. A method of manufacturing an active matrix substrate according to claim 14, further comprising removing residue from bottom portions between the banks after the repellency processing step of imparting repellency to the banks.

16. A method of manufacturing an active matrix substrate according to claim 14, wherein the residue processing step that is performed after the repellency processing step comprises a step of removing residue from bottom portions between the banks.

17. A method of manufacturing an active matrix substrate according to claim 14, wherein the residue processing step that is performed after the repellency processing step comprises a photo irradiation processing step.

18. A method of manufacturing an active matrix substrate according to claim 14, wherein the residue processing step that is performed after the repellency processing step comprises a plasma processing step that uses a predetermined processing gas.

19. A method of manufacturing an active matrix substrate according to claim 14, wherein the residue processing step that is performed after the repellency processing step comprises a plasma processing step that uses a predetermined processing gas and a photo irradiation processing step.

20. A method of manufacturing an active matrix substrate according to claim 14, wherein the residue processing step performs etching using acid.

21. A method of manufacturing an active matrix substrate according to claim 13, wherein the residue processing step is performed once again after the material placement step.

* * * * *